United States Patent
Abe et al.

(10) Patent No.: US 10,575,402 B2
(45) Date of Patent: Feb. 25, 2020

(54) RESIN COMPOSITION, WIRING LAYER LAMINATE FOR SEMICONDUCTOR, AND SEMICONDUCTOR DEVICE

(71) Applicant: HITACHI CHEMICAL COMPANY, LTD., Tokyo (JP)

(72) Inventors: Shinichiro Abe, Tokyo (JP); Kazuhiko Kurafuchi, Tokyo (JP); Tomonori Minegishi, Tokyo (JP); Kazuyuki Mitsukura, Tokyo (JP); Masaya Toba, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 16/336,135

(22) PCT Filed: Sep. 26, 2017

(86) PCT No.: PCT/JP2017/034778
§ 371 (c)(1),
(2) Date: Mar. 25, 2019

(87) PCT Pub. No.: WO2018/056466
PCT Pub. Date: Mar. 29, 2018

(65) Prior Publication Data
US 2019/0281697 A1    Sep. 12, 2019

(30) Foreign Application Priority Data

Sep. 26, 2016 (JP) .................................. 2016-186761
Jan. 23, 2017 (JP) .................................. 2017-009734

(51) Int. Cl.
*H05K 1/03* (2006.01)
*C08L 79/08* (2006.01)
(Continued)

(52) U.S. Cl.
CPC ............ *H05K 1/0373* (2013.01); *C08L 79/08* (2013.01); *H01L 23/49811* (2013.01);
(Continued)

(58) Field of Classification Search
CPC ...... H05K 1/03; H05K 1/0306; H05K 1/0313; H05K 1/0373
See application file for complete search history.

(56) References Cited

U.S. PATENT DOCUMENTS

2011/0221071 A1    9/2011    Motohashi et al.

FOREIGN PATENT DOCUMENTS

JP    2011-003884 A    1/2011
JP    2012-529770 A    11/2012
(Continued)

OTHER PUBLICATIONS

Jinseong Kim et al., "Application of Through Mold Via (TMV) as PoP Base Package", Electronic Components and Technology Conference (ECTC), 2008, p. 1089-p. 1092 (cited in specification).
(Continued)

*Primary Examiner* — Jeremy C Norris
(74) *Attorney, Agent, or Firm* — Fitch, Even, Tabin & Flannery, LLP

(57) ABSTRACT

One aspect of the present invention relates to a resin composition comprising a curable resin and a curing agent, which is used for forming an inter-wiring layer insulating layer in contact with a copper wiring.

17 Claims, 16 Drawing Sheets

(51) Int. Cl.
    *H01L 23/498*     (2006.01)
    *H01L 23/538*     (2006.01)
    *H05K 3/46*     (2006.01)
    *C08K 3/013*     (2018.01)

(52) U.S. Cl.
    CPC .... *H01L 23/49822* (2013.01); *H01L 23/5383* (2013.01); *H05K 3/4655* (2013.01); *C08K 3/013* (2018.01); *C08L 2203/202* (2013.01)

(56) References Cited

FOREIGN PATENT DOCUMENTS

| | | |
|---|---|---|
| WO | 02/096969 A1 | 12/2002 |
| WO | 2016-114286 A1 | 7/2016 |

OTHER PUBLICATIONS

S.W. Yoon et al., "Advanced Low Profile PoP Solution with Embedded Wafer Level PoP (eWLB-PoP) Technology", ECTC, 2012, p. 1250-p. 1254 (cited in specification).

*Fig.3*
(a)
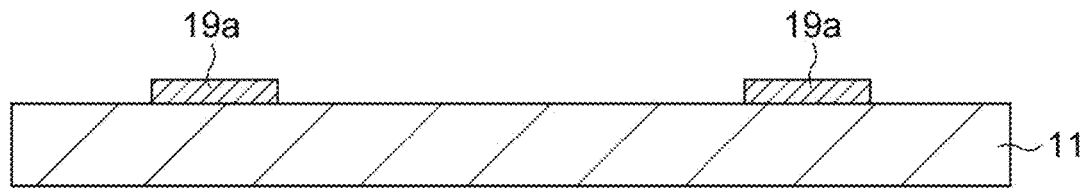
(b)
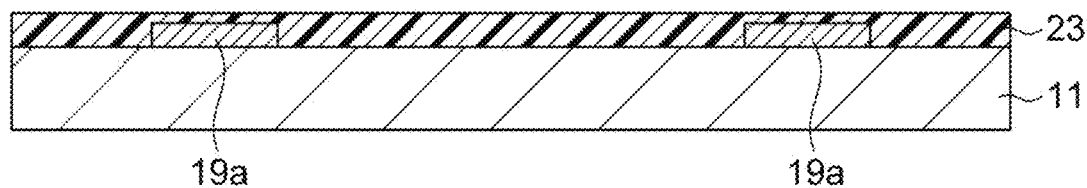
(c)
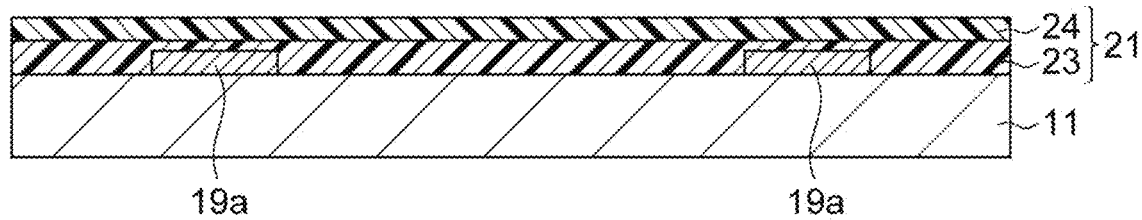

*Fig.4*
(a)
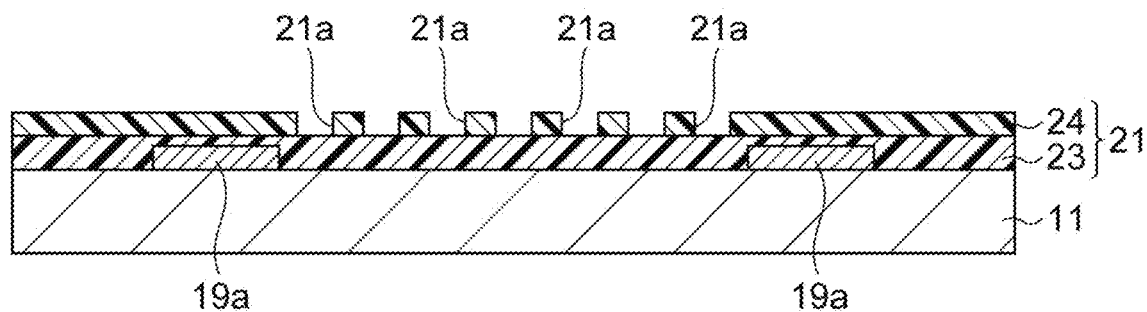
(b)
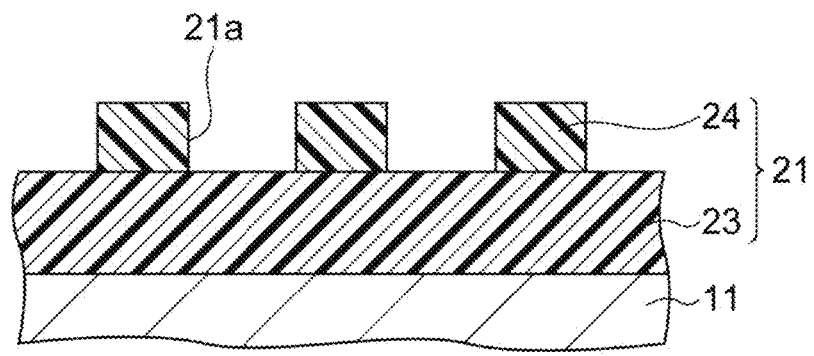

Fig.5
(a)
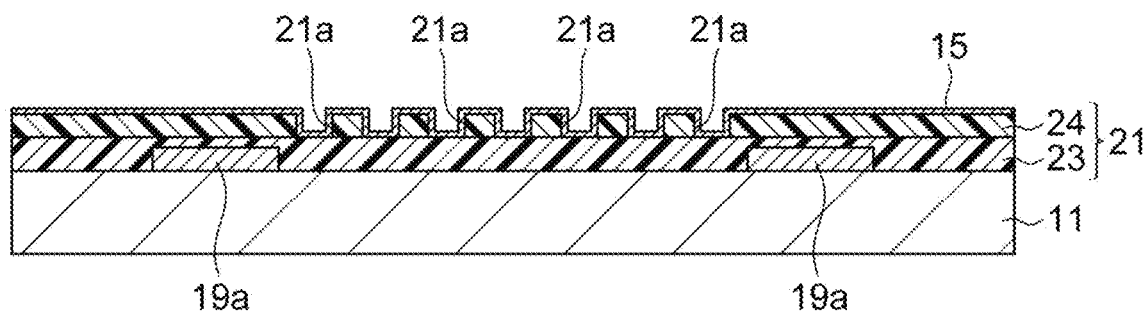
(b)
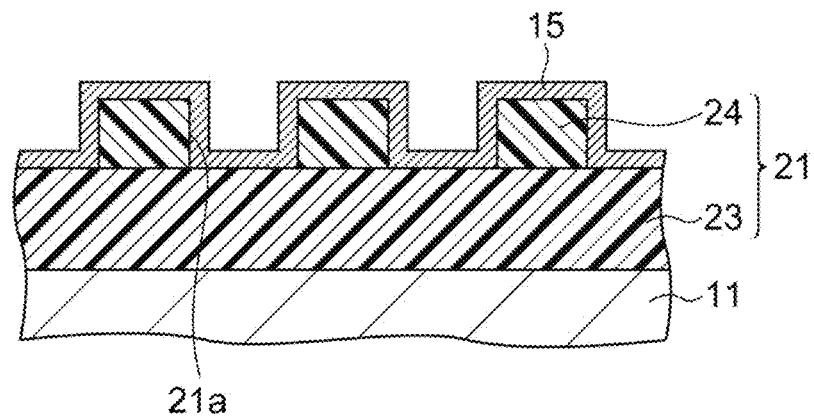

*Fig.6*
(a)
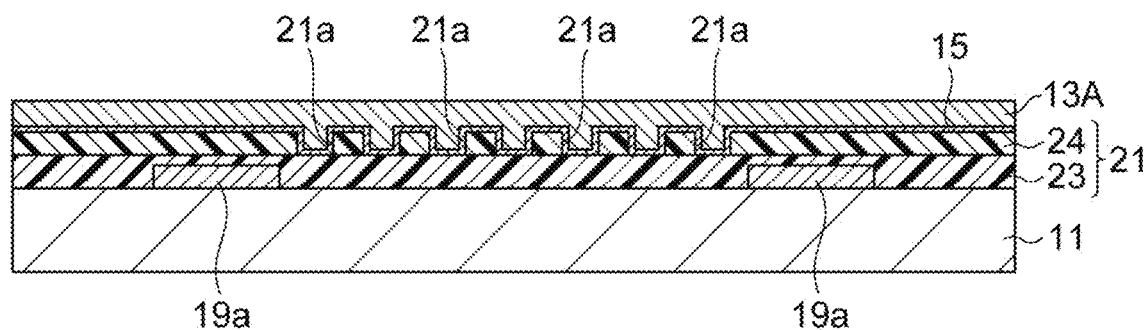
(b)
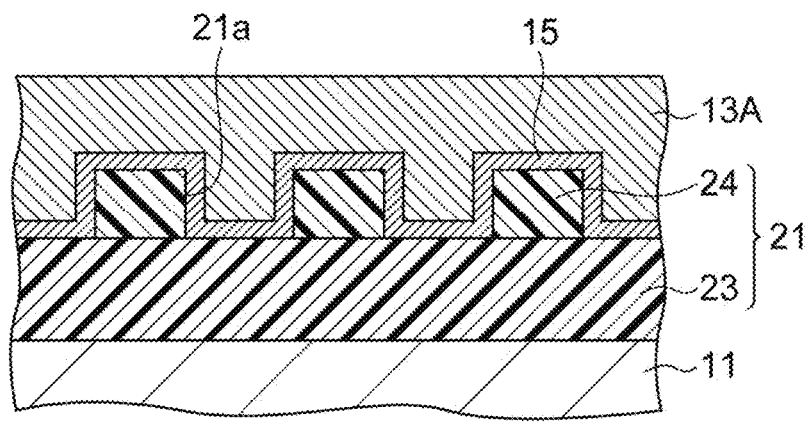

Fig.7
(a)
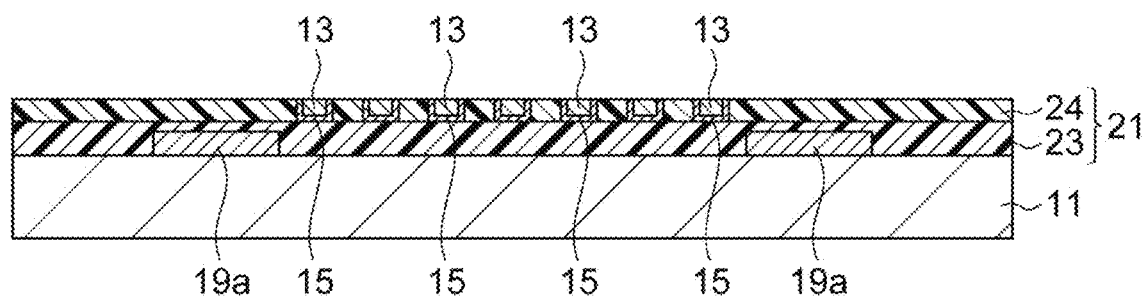
(b)
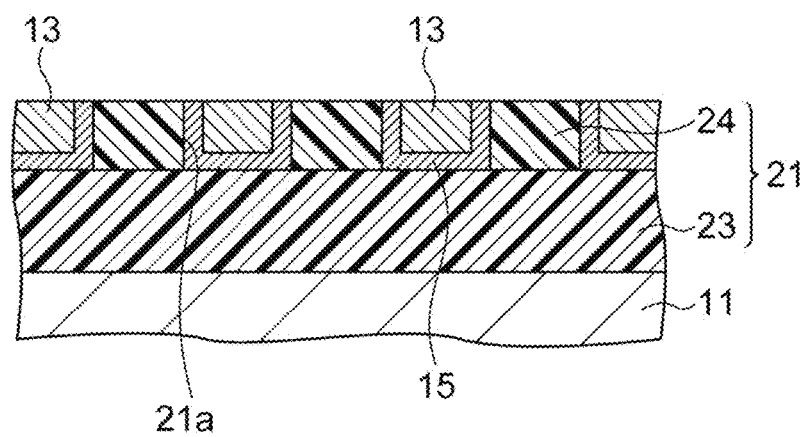

Fig.8
(a)
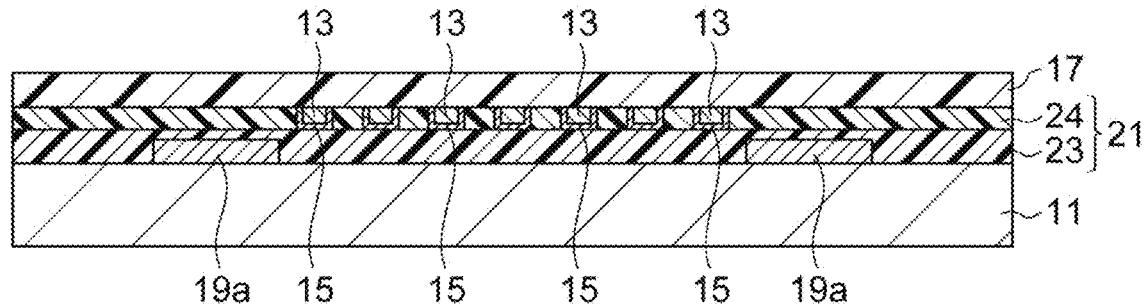
(b)
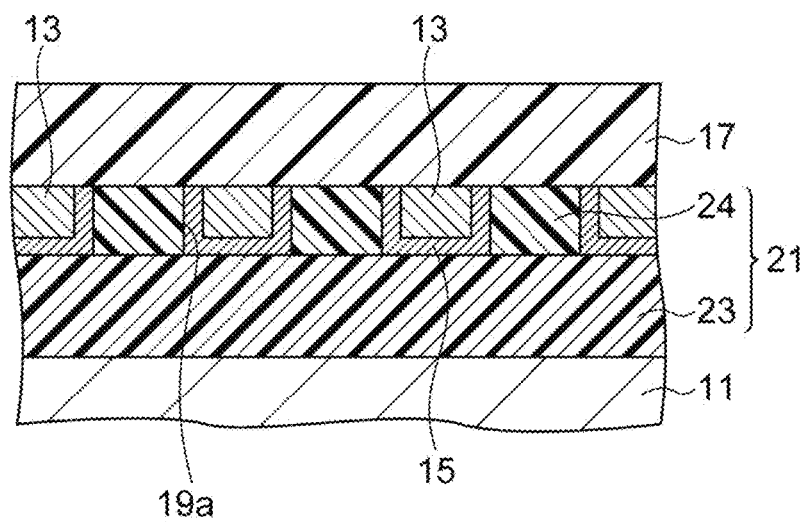

Fig.9
(a)
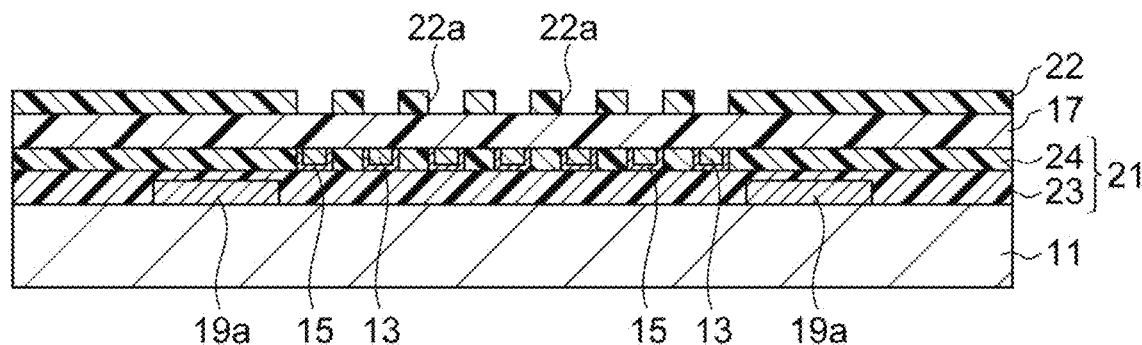
(b)
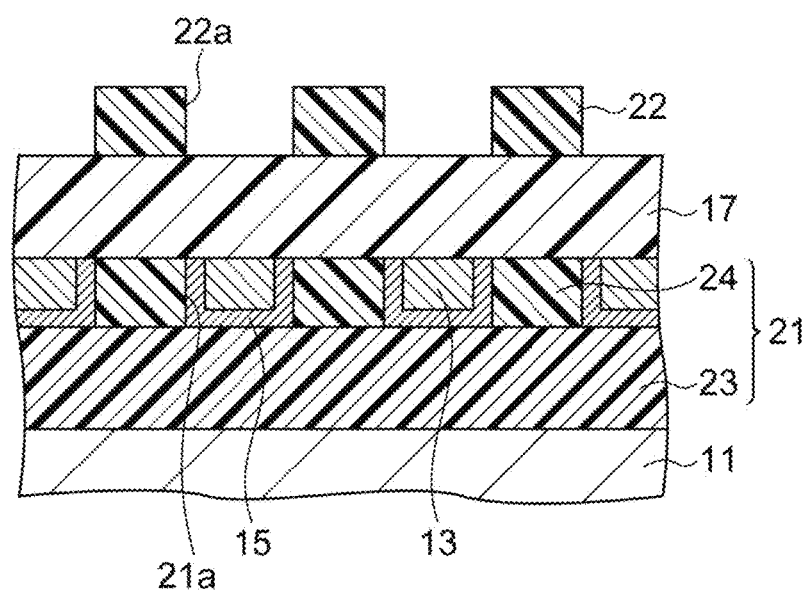

Fig.10
(a)
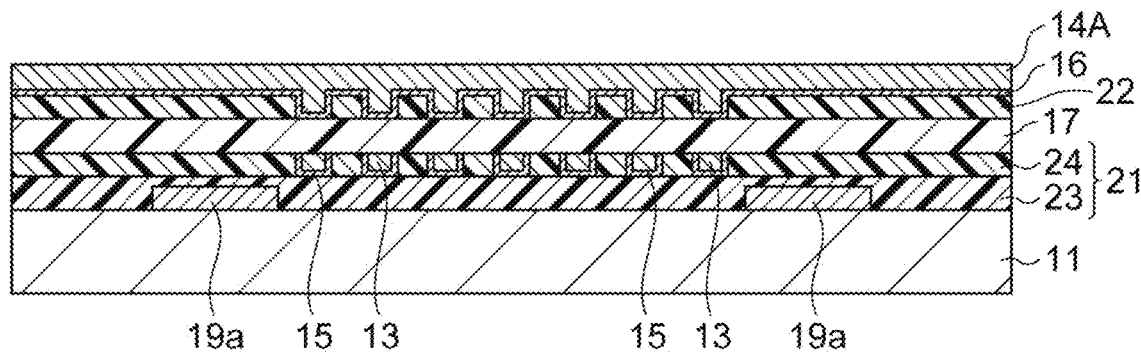
(b)
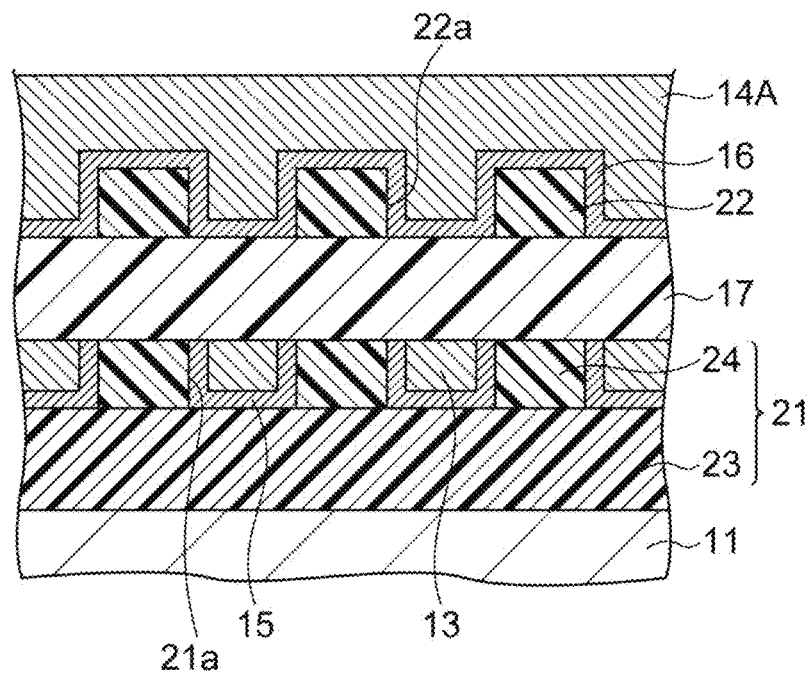

Fig.11
(a)
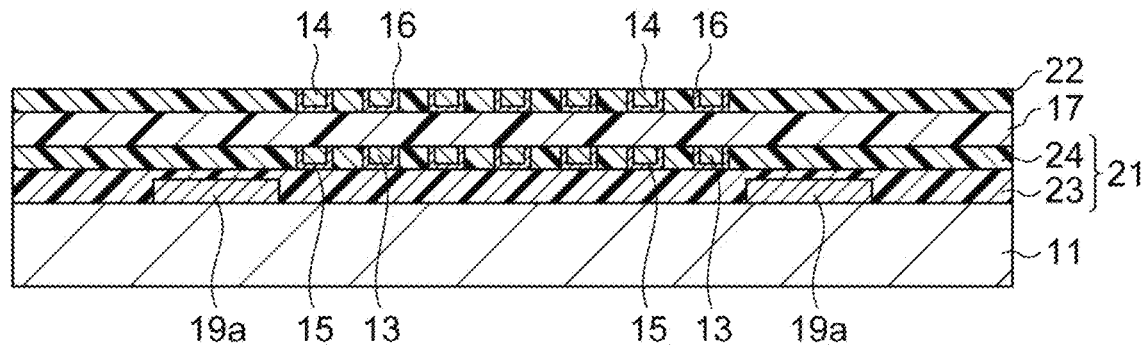
(b)
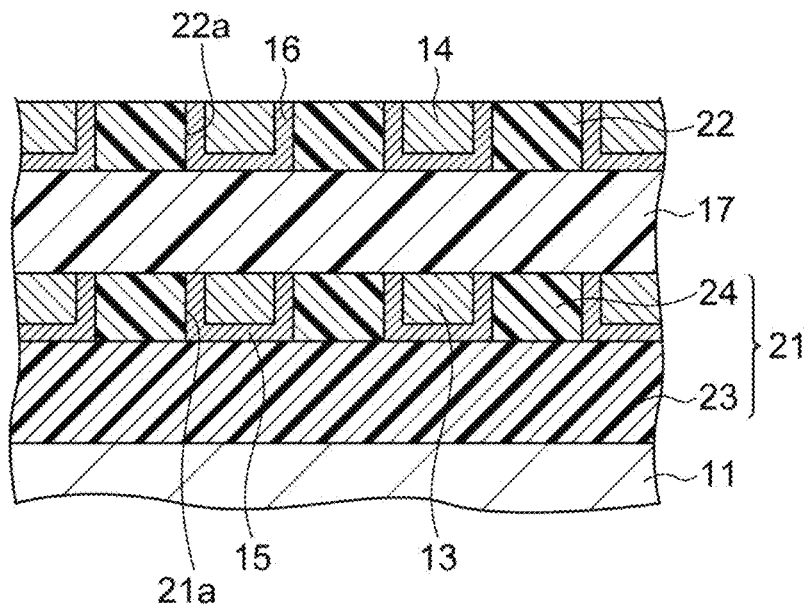

Fig.12
(a)
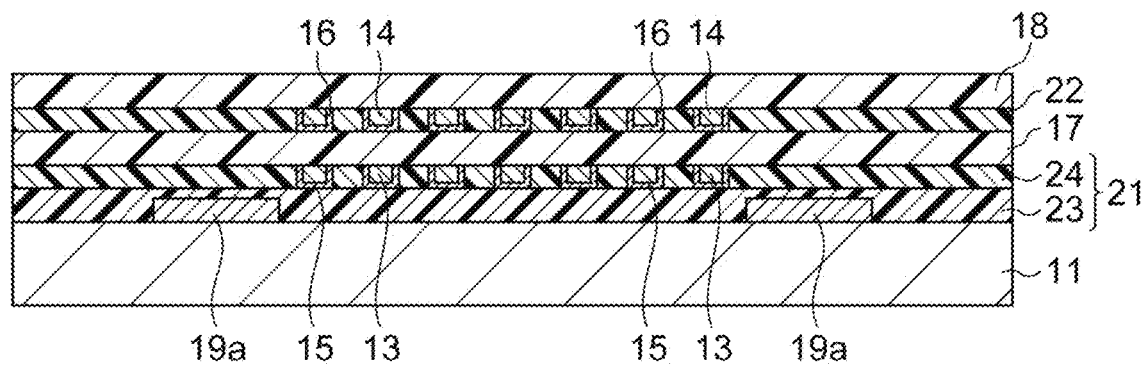
(b)
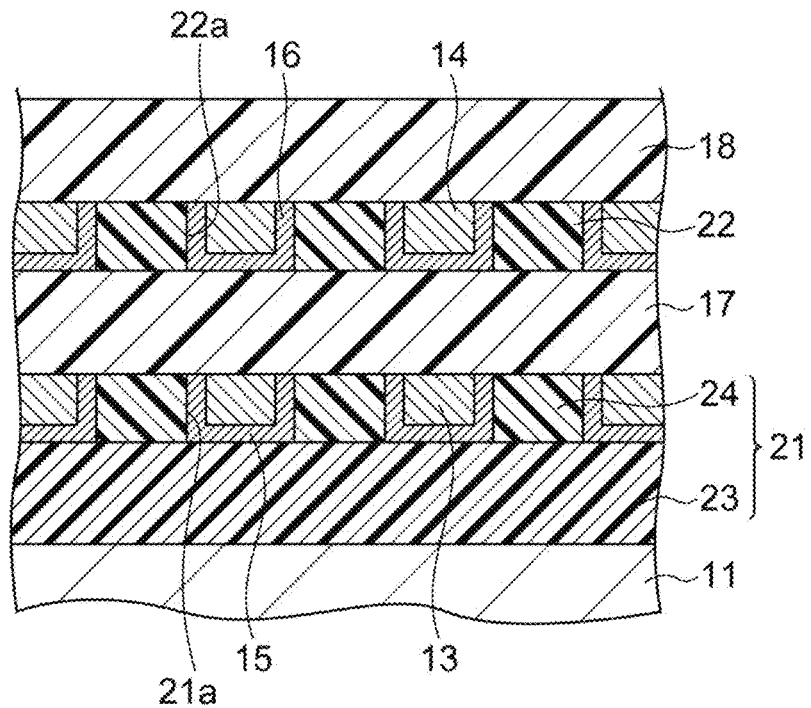

*Fig.13*
(a)
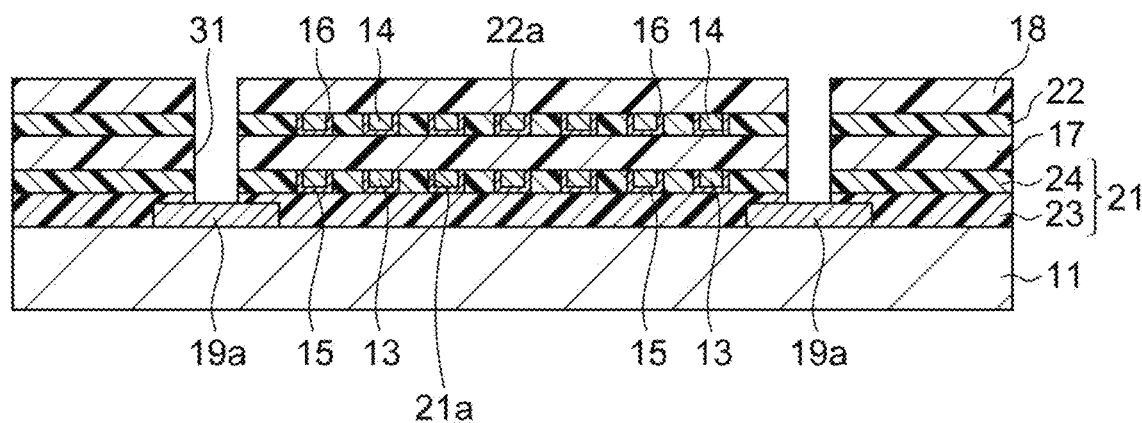
(b)
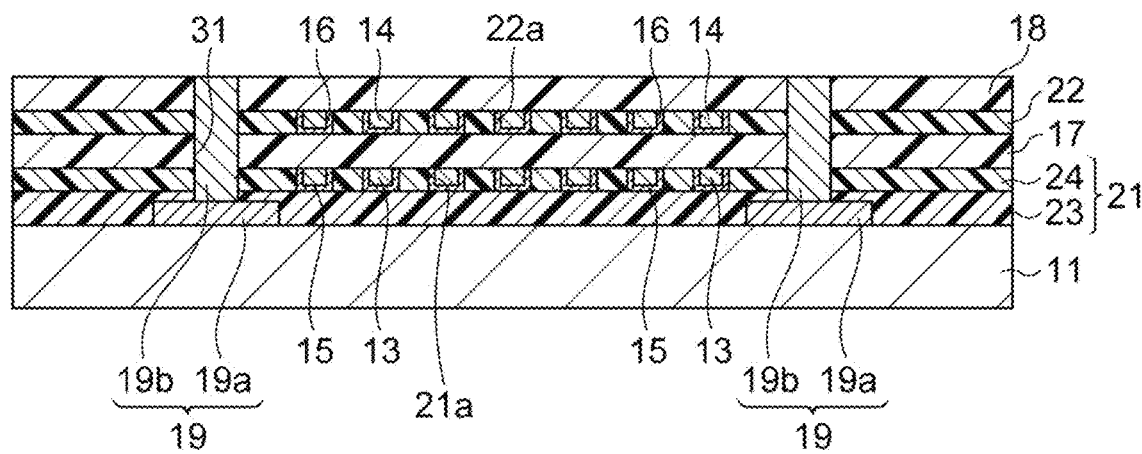

Fig.14
(a)
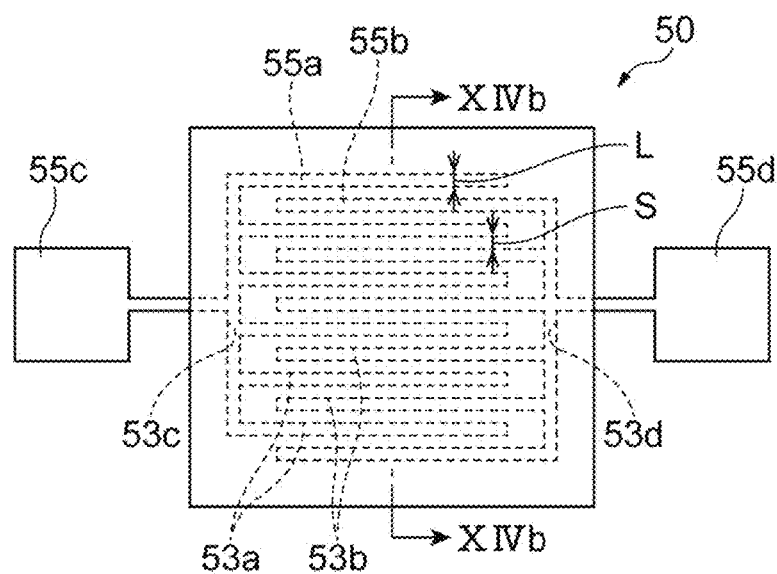
(b)
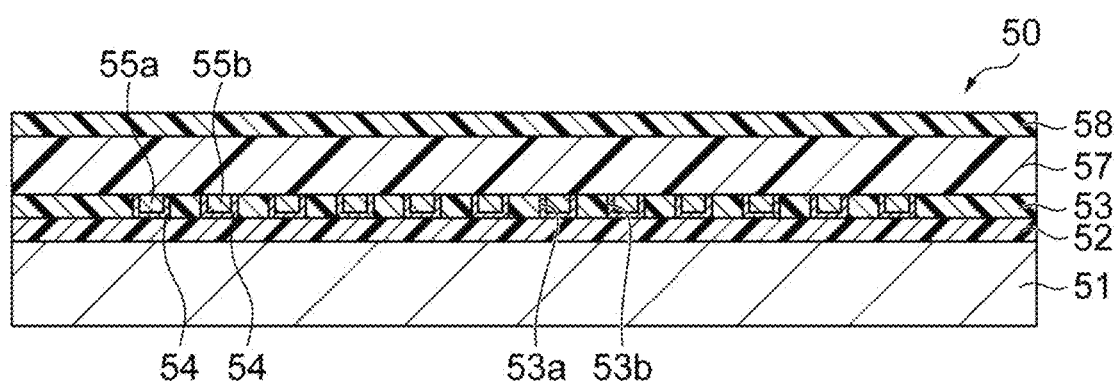

Fig.16
(a)
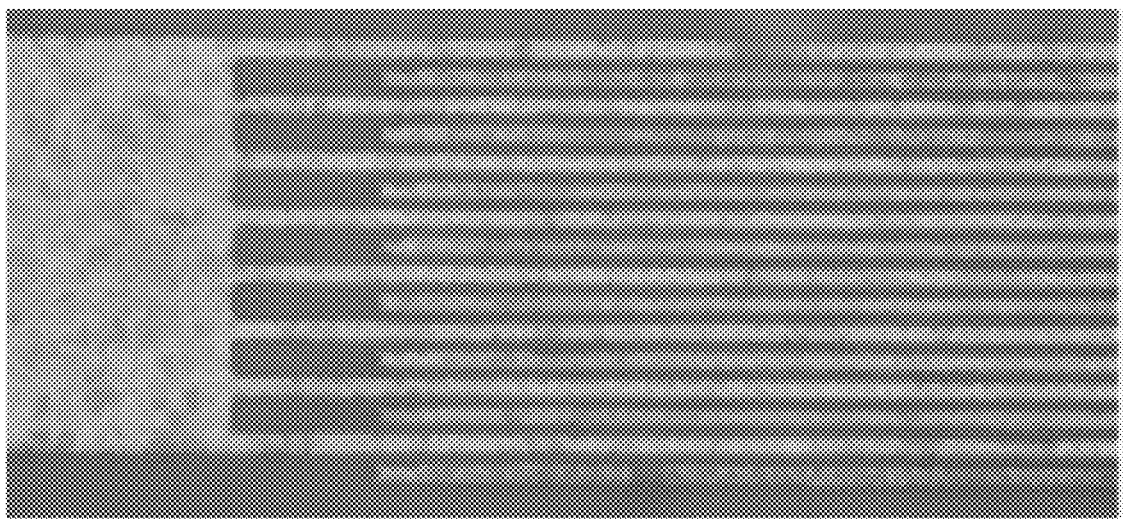
(b)
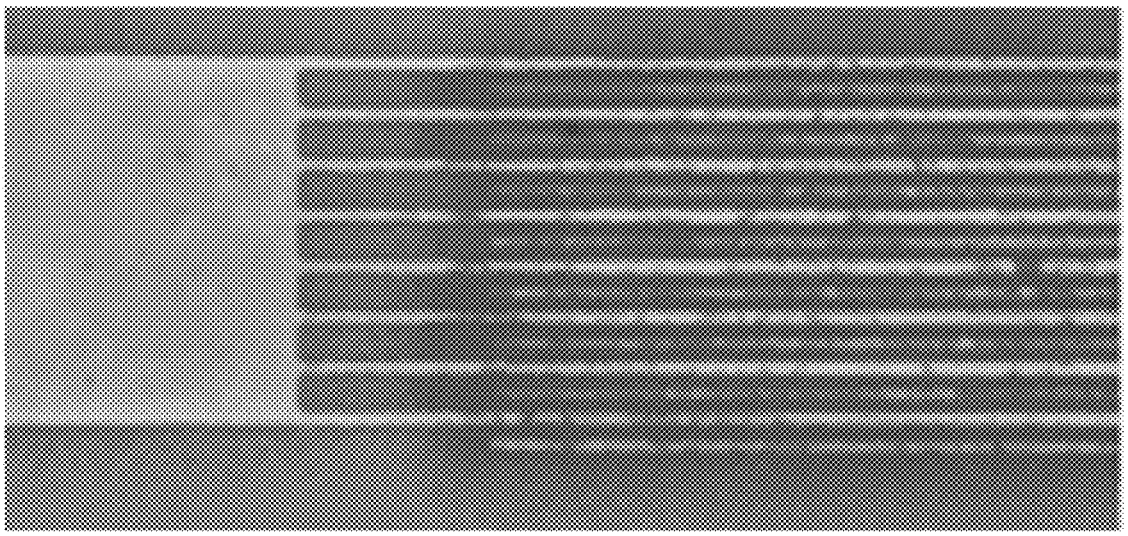

RESIN COMPOSITION, WIRING LAYER LAMINATE FOR SEMICONDUCTOR, AND SEMICONDUCTOR DEVICE

CROSS-REFERENCE TO RELATED APPLICATIONS

This application is a U.S. national phase application filed under 35 U.S.C. § 371 of International Application No. PCT/JP2017/034778, filed Sep. 26, 2017, designating the United States, which claims priority from Japanese Patent Application No. 2016-186761, filed Sep. 26, 2016, and Japanese Patent Application No. 2017-009734, filed Jan 23, 2017, which are hereby incorporated herein by reference in their entirety.

TECHNICAL FIELD

The present disclosure relates to a resin composition, a wiring layer laminate for a semiconductor, and a semiconductor device.

BACKGROUND ART

In order to achieve high densification and high performance of a semiconductor package, implementation for mix-loading chips having different performance into one package is proposed. In this case, high-density interconnection between chips, excellent in cost performance, is important (for example, refer to Patent Literature 1).

In Non Patent Literature 1 and Non Patent Literature 2, an aspect of a package-on-package (PoP) for connecting through stacking another different package on a package by flip-chip mounting is described. The PoP is an aspect widely employed in smartphones, tablet terminals and the like.

As other forms for high-density implementation of a plurality of chips, packaging using an organic substrate having a high-density wiring, Fan Out-Wafer Level Package (FO-WLP) having a Through Mold Via (TMV), packaging using a silicon or glass interposer, packaging using a Through Silicon Via (TSV), packaging using a chip embedded in a substrate for transmission between chips, and the like have been proposed.

In particular, as for a semiconductor wiring layer and FO-WLP, when semiconductor chips are mounted, a fine wiring layer for achieving high-density conduction between the semiconductor chips are required (for example, refer to Patent Literature 2).

CITATION LIST

Patent Literature

Patent Literature 1: Japanese Unexamined Patent Publication No. 2012-529770
Patent Literature 2: US Patent Application Publication No. 2011/0221071 Specification

Non Patent Literature

Non Patent Literature 1: Jinseong Kim et al., "Application of Through Mold Via (TMV) as PoP Base Package", Electronic Components and Technology Conference (ECTC), p. 1089-1092 (2008)
Non Patent Literature 2: S. W. Yoon et al., "Advanced Low Profile PoP Solution with Embedded Wafer Level PoP (eWLB-PoP) Technology", ECTC, p. 1250-1254 (2012)

SUMMARY OF INVENTION

Technical Problem

As for a build-up substrate, a wafer level package (WLP), a bottom package of a fan out PoP, etc., a wiring layer (semiconductor wiring layer) for mounting a plurality of semiconductor chips is used in some cases. For example, when a fine wiring having a line width and a space width of 5 μm or less is disposed in the wiring layer, the wiring is formed by a trench method. The trench method is a method of forming a metal layer to make a wiring in a trench (groove) by plating or the like, the trench being formed on the surface of an organic insulating layer by laser or the like. The shape of the wiring formed on the organic insulating layer, therefore, traces the shape of the groove.

In formation of a fine wiring in a wiring layer by the trench method, for example, a copper having high conductivity is used to lower the cost and suppress the increase in wiring resistance in some cases. When the copper wiring is formed, copper diffuses into the organic insulating layer in some cases. In this case, copper wirings may be short-circuited to each other through the diffused copper, so that there exists a problem with insulation reliability of the wiring layer.

An object of the present invention is to provide an inter-wiring layer insulating layer and a semiconductor device having excellent insulating reliability, and a resin composition from which the inter-wiring layer insulating layer can be suitably formed.

Solution to Problem

An aspect of the present invention relates to a resin composition comprising a curable resin and a curing agent, and the resin composition being used for forming an inter-wiring layer insulating layer in contact with a copper wiring. The inter-wiring layer insulating layer formed of the resin composition lying between the adjacent copper wirings suppresses the diffusion of copper from the copper wirings to a wiring layer laminate. As a result, the short-circuiting between copper wirings through diffused copper is suppressed, so that the insulating reliability of the wiring layer laminate can be substantially improved.

The curable resin may have at least two maleimide groups and a divalent hydrocarbon group. The hydrocarbon group may comprise a chain alkylene group having a main chain with 4 or more carbon atoms.

The hydrocarbon group may have 8 or more carbon atoms. The curable resin may have a divalent organic group having at least 2 imide bonds. The divalent organic group may be a group represented by the following formula (I):

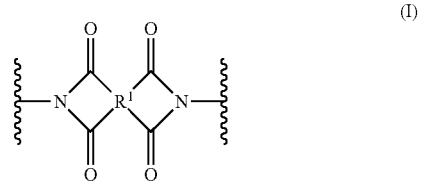

wherein $R^1$ represents a tetravalent organic group.

The hydrocarbon group may be a group represented by the following formula (II):

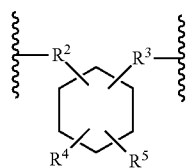

(II)

wherein $R^2$ and $R^3$ each independently represent an alkylene group, $R^4$ and $R^5$ each independently represent an alkyl group.

The curing agent may comprise a radical photopolymerization initiator. The resin composition may further comprise a compound having a (meth)acryloyl group and a coupling agent.

The resin composition may further comprise a thermoplastic resin. The content of chloride ions in a cured product of the resin composition may be 5 ppm or less. The elongation at fracture of a cured product of the resin composition may be 5 to 200%. The storage modulus of a cured product of the resin composition at 40° C. may be 10 MPa to 5 GPa. The glass transition temperature of a cured product of the resin composition may be 120 to 240° C. The dielectric constant of a cured product of the resin composition at 10 GHz may be 3.0 or less. The dielectric loss tangent of a cured product of the resin composition at 10 GHz may be 0.005 or less. The 5% weight loss temperature of a cured product of the resin composition may be 300° C. or more.

The moisture absorptivity of a cured product of the resin composition after placed in an environment at 130° C. and a relative humidity of 85% for 200 hours may be 1% by mass or less.

Another aspect of the present invention relates to a wiring layer laminate for a semiconductor comprising a plurality of wiring layers including an organic insulating layer, a copper wiring layer disposed in the organic insulating layer and a barrier metal film separating the copper wiring and the organic insulating layer, and an inter-wiring layer insulating layer disposed between the plurality of wiring layers, wherein a portion of a surface of the copper wiring is exposed to the principal surface side of one or both of the wiring layer, the exposed surface of the copper wiring is in contact with inter-wiring layer insulating layer, and the inter-wiring layer insulating layer is a layer having a moisture absorptivity of 1% by mass or less after placed in an environment at 130° C. and a relative humidity of 85% for 200 hours.

The inter-wiring layer insulating layer may be a cured product of the resin composition. The organic insulating layer may be a layer formed from photosensitive insulating resin. The barrier metal film may comprise at least one selected from the group consisting of titanium, nickel, palladium, chromium, tantalum, tungsten, and gold. The dielectric constant of the inter-wiring layer insulating layer upon application of 10 GHz may be 3.0 or less. The dielectric loss tangent of the inter-wiring layer insulating layer upon application of 10 GHz may be 0.005 or less. The 5% weight loss temperature of the inter-wiring layer insulating layer may be 300° C. or more.

Another aspect of the present invention relates to a semiconductor device comprising the wiring laminate for a semiconductor and a semiconductor element electrically connected to a copper wiring.

Advantageous Effects of Invention

According to the present invention, an inter-wiring layer insulating layer and a semiconductor device having excellent insulating reliability, and a resin composition from which the inter-wiring layer insulating layer can be suitably formed, can be provided.

BRIEF DESCRIPTION OF DRAWINGS

FIG. 3 is a view illustrating a method for producing a wiring layer laminate for a semiconductor.

FIG. 4 is a view illustrating a method for producing a wiring layer laminate for a semiconductor.

FIG. 5 is a view illustrating a method for producing a wiring layer laminate for a semiconductor.

FIG. 6 is a view illustrating a method for producing a wiring layer laminate for a semiconductor.

FIG. 7 is a view illustrating a method for producing a wiring layer laminate for a semiconductor.

FIG. 8 is a view illustrating a method for producing a wiring layer laminate for a semiconductor.

FIG. 9 is a view illustrating a method for producing a wiring layer laminate for a semiconductor.

FIG. 10 is a view illustrating a method for producing a wiring layer laminate for a semiconductor.

FIG. 11 is a view illustrating a method for producing a wiring layer laminate for a semiconductor.

FIG. 12 is a view illustrating a method for producing a wiring layer laminate for a semiconductor.

FIG. 13 is a view illustrating a method for producing a wiring layer laminate for a semiconductor.

FIG. 14 (a) is a plan view showing a sample for measurement and evaluation; and FIG. 14 (b) is a cross-sectional view taken along line XIVb-XIVb of FIG. 14 (a).

FIG. 16 (a) is a photograph showing a general view after the highly accelerated stress test in Example 3; and FIG. 16 (b) is a photograph showing a general view after the highly accelerated stress test in Comparative Example 2.

DESCRIPTION OF EMBODIMENTS

Figure 1:
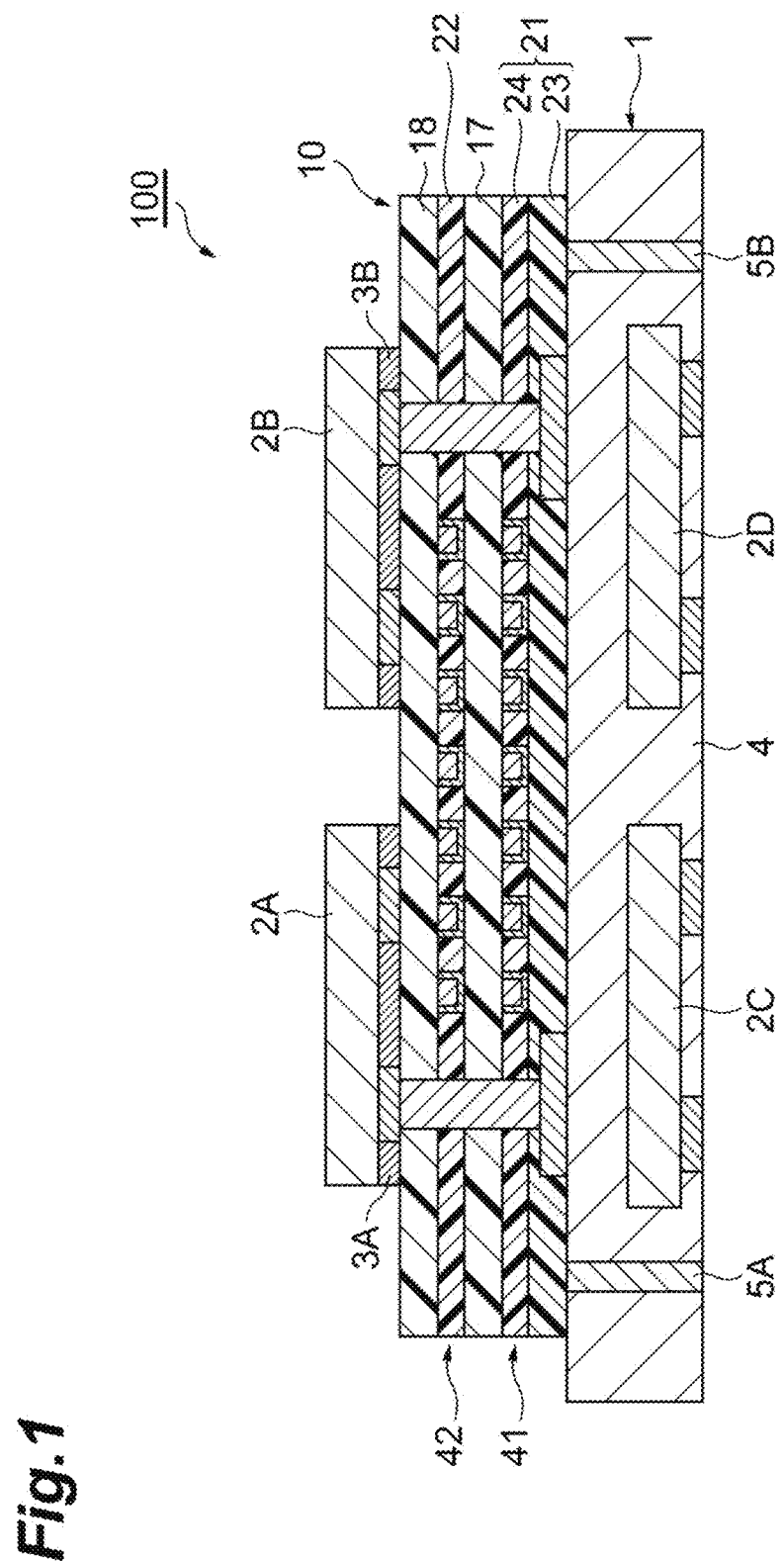
FIG. 1 is a schematic cross-sectional view of a semiconductor device having a wiring layer laminate for a semiconductor in an embodiment.

The present embodiment is described in detail as follows with reference to the drawings. In the following description, the same or corresponding parts are denoted by the same reference signs and redundant descriptions are omitted. The positional relationships between top and bottom, right and left, etc., are based on the positional relationships shown in the drawing, unless otherwise specified. Further, dimensional ratios are not limited to the ratios shown in the drawing.

When terms such as "left", "right", "front face", "rear face", "top", "bottom", "above", "below", "first" and "second" are used in the description of the present specification and claims, these are intended for illustration purposes, and may not mean permanent relative positions. The terms "layer" and "film" include not only a structure formed over the entire surface but also a structure formed over a part of the surface, when observed in the plan view. The term "step" includes not only an independent step but also a step of achieving an expected purpose without clear distinction from another step. The numerical range specified by using "to" indicates a range including the numerical values described in front and back of "to" as the minimum value and the maximum value, respectively. As for the numerical range described by a step-by-step manner in the present specification, the upper limit or the lower limit of the numerical range in a step may be replaced by the upper limit or the lower limit of the numerical range in another step.

The resin composition in an embodiment comprises a curable resin and a curing agent. The curable resin is a compound that is cured by heat or light. In other words, the resin composition is a photocurable (photosensitive) resin composition that is cured by light or a thermosetting resin composition that is cured by heat. The resin composition is favorably used to form an inter-wiring layer insulating layer in contact with a copper wiring. In the present specification, the copper wiring refers to a wiring containing at least copper. The copper wiring may be a wiring consisting of copper only, or a wiring further containing another component such as nickel, titanium and palladium in addition to copper.

The curable resin in an embodiment (hereinafter referred to as "first embodiment") is a maleimide compound comprising at least two maleimide groups and a divalent hydrocarbon group (hereinafter referred to simply as "maleimide compound").

The maleimide compound comprises, for example, at least two maleimide groups represented by the following formula (III).

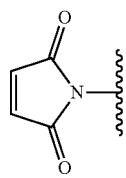

(III)

The maleimide compound is, for example, a compound represented by the following formula (IV) (bismaleimide compound):

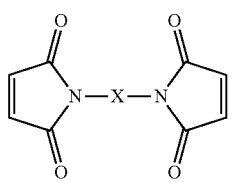

(IV)

wherein X represents a divalent linking group comprising a divalent hydrocarbon group.

The divalent hydrocarbon group contained in a linking group represented by X may be any one of a saturated hydrocarbon group and an unsaturated hydrocarbon group. The divalent hydrocarbon group may be in any one of a chain form and a cyclic form, and the divalent hydrocarbon group in a chain form may be in any one of a straight-chain form and a branched-chain form. The cyclic unsaturated hydrocarbon group may be an aromatic group. The divalent hydrocarbon group may comprise two or more of these groups.

The divalent hydrocarbon group preferably comprises a hydrocarbon group in a chain form, and more preferably comprises an alkylene group in a chain form having a main chain with 4 or more carbon atoms, from the perspective of capability to enhance the flexibility of a resin composition, the handling properties (tackiness, cracks, powder falling, etc.) and the strength of a film formed from the resin composition.

The alkylene group having a main chain with 4 or more carbon atoms is represented by $-(CR^aR^b)_m-$ (m represents an integer of 4 or more, and $R^a$ and $R^b$ each independently represent a hydrogen atom or an alkyl group with less than m carbon atoms). The number of carbon atoms in the main chain of the alkylene group (m) is preferably 4 or more, or 6 or more, and preferably 20 or less, 15 or less, or 10 or less.

The number of carbon atoms in the divalent hydrocarbon group is preferably 8 or more, 10 or more, or 15 or more, and preferably 300 or less, 250 or less, 200 or less, 100 or less, 70 or less or 50 or less, from the perspective of easily making a three-dimensional molecule structure of the maleimide compound and enabling a polymer to have a reduced density or a reduced dielectric constant through increase of the free volume. The number of carbon atoms in the divalent hydrocarbon group may be preferably 8 to 300, 8 to 250, 8 to 200, or 8 to 100, from the same perspective. The divalent hydrocarbon group is preferably an alkylene group that may have a branch, with 8 to 300, 8 to 250, 8 to 200, or 8 to 100 carbon atoms, more preferably an alkylene group that may have a branch, with 10 to 70 carbon atoms, still more preferably an alkylene group that may have a branch, with 15 to 50 carbon atoms.

From the perspective of more effectively enhancing the high-frequency properties and the resistance to HAST (Highly Accelerated temperature and humidity Stress Test), the divalent hydrocarbon group in an embodiment is a group represented by the following formula (II):

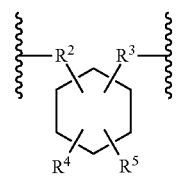

(II)

wherein $R^2$ and $R^3$ each independently represent an alkylene group, and $R^4$ and $R^5$ each independently represent an alkyl group.

The number of carbon atoms in the alkylene groups represented by $R^2$ and $R^3$ is preferably 4 to 50, more preferably 5 to 25, still more preferably 6 to 10, particularly preferably 7 to 10, from the perspective of further improving the flexibility and achieving easy synthesis. The alkylene groups represented by $R^2$ and $R^3$ are chain alkylene groups having the main chain with 4 or more carbon atoms.

The number of carbon atoms in the alkylene group represented by $R^4$ is preferably 4 to 50, more preferably 5 to 25, still more preferably 6 to 10, particularly preferably 7 to 10, from the perspective of further improving the flexibility and achieving easy synthesis. The number of carbon atoms in the alkylene group represented by $R^5$ is preferably 2 to 50, more preferably 3 to 25, still more preferably 4 to 10, particularly preferably 5 to 8, from the perspective of further improving the flexibility and achieving easy synthesis.

The maleimide compound preferably comprises a plurality of divalent hydrocarbon groups from the perspective of more effectively enhancing the high-frequency properties and the elongation percentage. In this case, the divalent hydrocarbon groups may be the same or different from each other. The maleimide compound comprises preferably 2 to 40, more preferably 2 to 20, still more preferably 2 to 10 divalent hydrocarbon groups.

Examples of the divalent hydrocarbon group may include an alkylene group such as a nonylene group, a decylene group, an undecylene group, a dodecylene group, a tetradecylene group, a hexadecylene group, an octadecylene, a nonadecylene group, an icocylene group, a henicocylene group, a docycylene group, a tricocylene group, a tetracocylene group, a pentacocylene group, a hexacocylene group, a heptacocylene group, an octacocylene group, a nonacocylene group, and a tri-acontylene group; an arylene group such as a benzylene group, a phenylene group, and a naphthylene group; an arylenealkylene group such as a phenylene methylene group, a phenylene ethylene group, a benzyl propylene group, a naphthylene methylene group, and a naphthylene ethylene group; and an arylene dialkylene group such as a phenylene dimethylene group and a phenylene diethylene group.

The linking group represented by X may consist of the divalent hydrocarbon groups only, or may comprise another organic group in addition to the divalent hydrocarbon group. The other organic group is, for example, a divalent organic group having at least two imide bonds.

The divalent organic group having at least two imide bonds may be, for example, a group represented by the following formula (I):

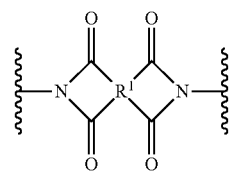

(I)

wherein $R^1$ represents a tetravalent organic group.

The tetravalent organic group represented by $R^1$ may be, for example, a hydrocarbon group from the perspective of handling properties. The number of carbon atoms in the hydrocarbon group may be, for example, 1 to 100, 2 to 50, or 4 to 30.

The hydrocarbon group may be substituted, and may include a substituted or unsubstituted siloxane group. Examples of the siloxane group include a group derived from dimethyl siloxane, methyl phenyl siloxane, and diphenyl siloxane.

The substituent may be, for example, an alkyl group, an alkenyl group, an alkynyl group, a hydroxyl group, an alkoxy group, a mercapto group, a cycloalkyl group, a substituted cycloalkyl group, a heterocyclic group, a substituted heterocyclic group, an aryl group, a substituted aryl group, a heteroaryl group, a substituted heteroaryl group, an aryloxy group, a substituted aryloxy group, a halogen atom, a haloalkyl group, a cyano group, a nitro group, a nitroso group, an amino group, an amide group, —C(O)H, —C(O)—, —S—, —S(O)$_2$—, —OC(O)—O—, —C(O)—NR$^c$, —NR$^c$C(O)—N(R$^c$)$_2$, —OC(O)—N(R$^c$)$_2$, an acyl group, an oxyacyl group, a carboxyl group, a carbamate group, a sulfonyl group, a sulfonamide group, a sulfuryl group or the like. Here, R$^c$ represents a hydrogen atom or an alkyl group. One or two or more of the substituents may be selected corresponding to the purpose, the use or the like.

The tetravalent organic group may be, for example, a tetravalent residue of an acid anhydride having two or more anhydride rings in a molecule, i.e., a tetravalent group with two acid anhydride groups (—CO(=O)OC(=O)—) removed from an acid anhydride. Examples of the acid anhydride include compounds to be described below.

The organic group represented by $R^1$ is preferably a tetravalent aromatic group, more preferably a residue with two acid anhydride groups removed from pyromellitic acid anhydride, from the perspective of excellence in the high frequency properties. The divalent organic group having at least two imide bonds is preferably a group represented by the following formula (V).

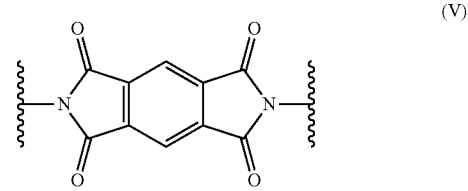 [SMILES: *n1c(=O)c2cc3c(=O)n(*)c(=O)c3cc2c1=O]

(V)

From the perspective of excellence in dielectric properties, the divalent organic group having at least two imide bonds may be a group represented by the following formula (VI) or (VII):

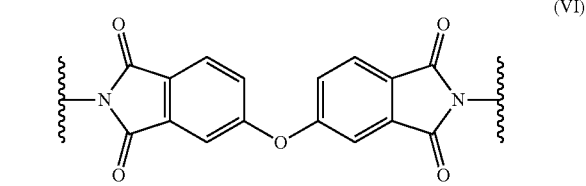

(VI)

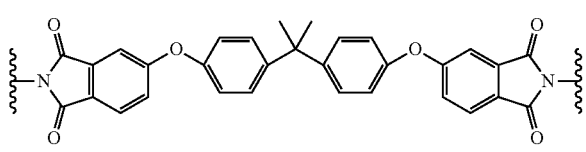

(VII)

Preferably the maleimide compound has a plurality of divalent organic groups having at least two imide bonds from the perspective of excellence in the high-frequency properties and excellence in the compatibility with another resin when the resin composition further contains the other resin (in particular, a thermoplastic elastomer resin having a high molecular weight). In that case, the divalent organic groups may be the same or different from each other. The maleimide compound comprises preferably 2 to 40, more preferably 2 to 20, still more preferably 2 to 10 of the divalent organic groups.

More specifically, in an embodiment, the maleimide compound may be, for example, a compound represented by the following formula (VIII), or a compound represented by the following formula (IX):

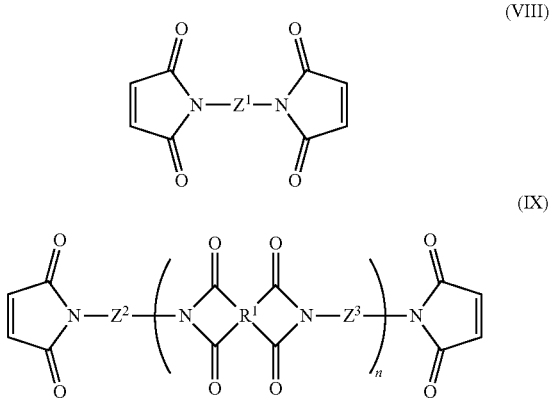

wherein $Z^1$, $Z^2$ and $Z^3$ each independently represent the divalent hydrocarbon group, $R^1$ is synonymous with R1 in the formula (I), and n represents an integer of 1 to 10. When n is 2 or more, a plurality of $Z^3$ may be the same or different from each other.

As the maleimide compound, for example, a commercially available product may be purchased and used. Examples of the commercially available product include a maleimide compound represented by the formula (VIII) such as BMI-TMH, BMI-1000, BMI-1000H, BMI-1100, BMI-1100H, BMI-2000, BMI-2300, BMI-3000, BMI-3000H, BMI-4000, BMI-5100, BMI-7000 and BMI-7000H (all identified by trade names, manufactured by Daiwa Kasei industry Co., Ltd.), and BMI, BMI-70, and BMI-80 (all identified by trade names, manufactured by K.I. Chemical Industry Co., Ltd.). Examples of the commercially available product include a maleimide compound represented by the formula (IX) such as BMI-1500, BMI-1700, BMI-3000, BMI-5000 and BMI-9000 (all identified by trade names, manufactured by Designer Molecules Inc. (DMI)).

The molecular weight of the maleimide compound is not particularly limited. The weight average molecular weight Mw of the maleimide compound may be 1000 or more, 1500 or more, or 3000 or more, and may be 30000 or less, 20000 or less, or 15000 or less. The weight average molecular weight Mw of the maleimide compound is preferably 1000 to 30000, more preferably 1500 to 20000, from the perspective of the solubility in a solvent and the compatibility with other components such as a monomer and a resin.

The weight average molecular weight Mw of the maleimide compound can be measured by the gel permeation chromatography (GPC). The measurement conditions of GPC are as follows.
Pump: L-6200 [manufactured by Hitachi High-Technologies Corporation]
Detector: L-3300 RI [manufactured by Hitachi High-Technologies Corporation]
Column oven: L-655A-52 [manufactured by Hitachi High-Technologies Corporation]
Guard column and column: TSK Guardcolumn HHR-L+ TSKgel G4000HHR+TSKgel G2000 HHR [trade names, all manufactured by Tosoh Corporation]
Column size: 6.0×40 mm (guard column), 7.8×300 mm (column)
Eluent: tetrahydrofuran
Sample concentration: 30 mg/5 mL
Injection volume: 20 μL
Measurement temperature: 40° C.

The content of the maleimide compound may be, for example, 50% by mass or more, 65% by mass or more, or 80% by mass or more, and 99% by mass or less, 95% by mass or less, or 90% by mass or less, based on the whole solid content in the resin composition.

The curing agent in the first embodiment may comprise a radical photopolymerization initiator. In other words, in an embodiment, the resin composition contains a maleimide compound and a radical photopolymerization initiator.

The radical photopolymerization initiator may be, for example, an alkylphenone radical photopolymerization initiator, an acyl phosphine oxide radical photopolymerization initiator, etc.

Examples of the alkylphenone radical photopolymerization initiator commercially available include Irgacure 651, Irgacure 184, DAROCURE 1173, Irgacure 2959, Irgacure 127, DAROCURE MBF, Irgacure 907, Irgacure 369, and Irgacure 379EG, which are manufactured by BASF Corporation. Examples of the acyl phosphine oxide radical photopolymerization initiator commercially available include Irgacure 819 and LUCIRIN TPO manufactured by BASF Corporation.

The radical photopolymerization initiator may be another commercially available radical photopolymerization initiator such as Irgacure 784, Irgacure OXE01, Irgacure OXE02, and Irgacure 754.

As the radical photopolymerization initiator, Irgacure 907, Irgacure 369, Irgacure 379EG, Irgacure OXE01, and Irgacure OXE02 are preferably used from the perspective of high sensitivity, and Irgacure 907, Irgacure 379EG, Irgacure OXE02 are more preferably used from the perspective of solubility in solvent. The radical photopolymerization initiators may be used alone or in combination of two or more thereof, corresponding to the purpose, the application, etc.

The content of the radical photopolymerization initiator is preferably 0.1 to 10 parts by mass from the perspective of sufficient curing of the curable resin, more preferably 1 to 6 parts by mass from the perspective that unreacted substances further hardly remain, based on 100 parts by mass of the curable resin.

The resin composition in the first embodiment may further contain a compound having a (meth)acryloyl group (hereinafter also referred to as "(meth)acryloyl compound"). In other words, in an embodiment, the resin composition contains a maleimide compound, a (meth)acryloyl compound and a curing agent (radical photopolymerization initiator). It is assumed that the coupling agent having a (meth)acryloyl group to be described below is not included in the (meth)acryloyl compound.

The (meth)acryloyl compound may be, for example, tricyclodecane dimethanol di(meth)acrylate, ethoxylated bisphenol A di(meth)acrylate, propoxylated/ethoxylated bisphenol A (meth)acrylate, dipentaerythritol poly(meth)acrylate, ethoxylated isocyanuric acid tri(meth)acrylate, polyethylene glycol di(meth)acrylate, a silsesquioxane derivative having a (meth)acryloyl group, and the like.

The (meth)acryloyl compound is preferably tricyclodecane dimethanol di(meth)acrylate, ethoxylated bisphenol A di(meth)acrylate, propoxylated/ethoxylated bisphenol A (meth)acrylate, or a silsesquioxane derivative having a (meth)acryloyl group, from the perspective of excellence in the heat resistance, and more preferably tricyclodecane dimethanol di(meth)acrylate, from the perspective of excellence in the compatibility with a maleimide compound.

The content of the (meth)acryloyl compound is preferably 0.1 to 98 parts by mass, more preferably 2 to 50 parts by mass from the perspective of excellence in the elongation percentage, and still more preferably 5 to 40 parts by mass from the perspective of compatibility of the high frequency properties and the fine wiring formability, based on 100 parts by mass of the maleimide compound and the (meth)acryloyl compound in total.

The resin composition in the first embodiment may further contain a coupling agent. In other words, in an embodiment, the resin composition contains a maleimide compound, a curing agent (radical photopolymerization initiator) and a coupling agent, and in another embodiment, the resin composition contains a maleimide compound, a (meth) acryloyl compound, a curing agent (radical photopolymerization initiator), and a coupling agent.

The coupling agent may be, for example, a silane coupling agent. The silane coupling agent may have, for example, a vinyl group, an epoxy group, a styryl group, an acryloyl group, a methacryloyl group, an amino group, a ureido group, an isocyanate group, an isocyanurate group, or a mercapto group.

Examples of the silane coupling agent having a vinyl group include KBM-1003 and KBE-1003 (both identified by trade names, manufactured by Shin-Etsu Chemical Co., Ltd., the same applies hereinafter). Examples of silane coupling agent having an epoxy group include KBM-303, 402, 403, KBE-402, 403, X-12-981S and X-12-984S. Examples of the silane coupling agent having a styryl group include KBM-1403. Examples of the silane coupling agents having a methacryloyl group include KBM-502, 503, KBE-502 and 503. Examples of the silane coupling agent having an acryloyl group include KBM-5103, X-12-1048 and X-12-1050. Examples of the silane coupling agent having an amino group include KBM-602, 603, 903, 573, 575, KBE-903, 9103P and X-12-972F. Examples of the silane coupling agent having a ureido group include KBE-585. Examples of the silane coupling agent having an isocyanate group include KBE-9007 and X-12-1159L. Examples of the silane coupling agent having an isocyanurate group include KBM-9659. Examples of the silane coupling agents having a mercapto group include KBM-802, 803, X-12-1154 and X-12-1156. These may be used alone or in combination of two or more thereof, corresponding to the purpose, and the application.

The content of the silane coupling agent is preferably 0.01 to 5 parts by mass from the perspective of improving the adhesiveness to glass, silica, or the like, and more preferably 0.1 to 2 parts by mass from the perspective that unreacted substances further hardly remain, based on 100 parts by mass of the curable resin.

The resin composition in the first embodiment may further contain a thermosetting resin as the curable resin in addition to the maleimide compound. Examples of the thermosetting resin include an epoxy resin, a phenolic resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin. These may be used alone or may be used as a mixture of two or more. The thermosetting resin is preferably an epoxy resin or a cyanate resin, from the perspective of heat resistance and electrical insulation.

Examples of the epoxy resin include a bisphenol A epoxy resin, a bisphenol F epoxy resin, a bisphenol S epoxy resin, a phenol novolac epoxy resin, a cresol novolac epoxy resin, a bisphenol A novolac epoxy resin, a bisphenol F novolac epoxy resin, a stilbene epoxy resin, an epoxy resin containing a triazine skeleton, an epoxy resin containing a fluorene skeleton, a biphenyl epoxy resins, a xylylene epoxy resin, a biphenyl aralkyl epoxy resin, a naphthalene epoxy resin, a dicyclopentadiene epoxy resin, an alicyclic epoxy resin, polyfunctional phenols and diglycidyl ether compounds of polycyclic aromatics such as anthracene, and phosphorus-containing epoxy resins with a phosphorus compound introduced thereto. The epoxy resin is a biphenyl aralkyl epoxy resin or a naphthalene epoxy resin from the perspective of heat resistance and incombustibility. These may be used alone or as a mixture of two or more thereof.

Examples of the cyanate resin include a bisphenol cyanate resin such as a novolac cyanate resin, a bisphenol A cyanate resin, a bisphenol E cyanate resin, and a tetramethyl bisphenol F cyanate resin, and a prepolymer including triazine made from a part of those. These may be used alone or as a mixture of two or more thereof. The cyanate resin is preferably a novolac cyanate resin from the perspective of heat resistance and incombustibility.

As the curing agent, the resin composition in the first embodiment may further contain another curing agent in addition to a radical photopolymerization initiator. Examples of the other curing agent include an aromatic amine compound such as dicyandiamide, 4,4'-diaminodiphenylmethane, 4,4'-diamino-3,3'-diethyl-diphenylmethane, 4,4'-diaminodiphenyl sulfone, phenylene diamine, xylene diamine; an aliphatic amine compound such as hexamethylene diamine and 2,5-dimethyl hexamethylenediamine; and melamine and a guanamine compound such as benzoguanamine. The other curing agent is preferably an aromatic amine compound from the perspective that good reactivity and heat resistance can be obtained.

When the resin composition contains a cyanate resin, the resin composition may further contain, for example, a polyfunctional compound such as phenol novolac, cresol novolac and an aminotriazine novolac resin; and an acid anhydride such as phthalic acid anhydride, pyromellitic acid anhydride, maleic acid anhydride, and a maleic acid anhydride copolymer. These may be used alone or as a mixture of two or more thereof.

The resin composition according to the first embodiment may further contain thermoplastic elastomers. Examples of the thermoplastic elastomers include styrene elastomers, olefin elastomers, urethane elastomers, polyester elastomers, polyamide elastomers, acrylic elastomers, silicone elastomers, and derivatives thereof. A thermoplastic elastomer is made of a hard segment component and a soft segment component, and in general, the former contributes to the heat resistance and strength and the latter contributes to the flexibility and toughness. The thermoplastic elastomers are preferably styrene elastomers, olefin elastomers, polyamide elastomers, or silicone elastomers, from the perspective of further improving the heat resistance and insulation reliability. These may be used alone or as a mixture of two or more thereof.

As the thermoplastic elastomers, ones having a reactive functional group at a molecular end or in a molecular chain can be used. Examples of the reactive functional group include an epoxy group, a hydroxyl group, a carboxyl group, an amino group, an amide group, an isocyanate group, an acryloyl group, a methacryloyl group, and a vinyl group. Having a reactive functional group at a molecular end or in a molecular chain, the thermoplastic elastomers can have improved compatibility with a curable resin, so that the internal stress occurring during curing of a resin composition can be more effectively reduced. As a result, the warpage of a substrate can be significantly reduced. The reactive functional group is preferably an epoxy group, a hydroxyl group, a carboxyl group, an amino group or an amide group from the perspective of adhesiveness to a metal, and more preferably an epoxy group, a hydroxyl group or an amino group from the perspective of further improving the heat resistance and insulation reliability.

The content of the thermoplastic elastomer is preferably 0.1 to 50 parts by mass, more preferably 2 to 30 parts by mass, based on 100 parts by mass of the total solid content in the resin composition, from the perspective that the low shrinkage and low thermal expansion of a cured product can be effectively exhibited.

The resin composition in an embodiment (hereinafter also referred to as "second embodiment") further contains a thermoplastic resin in addition to the curable resin and the curing agent. In that case, the curable resin is preferably a thermosetting resin. In other words, the resin composition in the second embodiment contains a thermoplastic resin, a thermosetting resin and a curing agent.

The thermoplastic resin is not particularly limited so long as the resin is softened by heating. The thermoplastic resin may have a reactive functional group at a molecular end or in a molecular chain. Examples of the reactive functional group include an epoxy group, a hydroxyl group, a carboxyl group, an amino group, an amide group, an isocyanate group, an acryloyl group, a methacryloyl group, a vinyl group, and a maleic acid anhydride group.

The thermoplastic resin comprises, for example, a resin having a siloxane chain, from the perspective that the moisture absorbing properties and the dielectric constant can be suppressed. Examples of the thermoplastic resin having a siloxane include siloxane-containing acrylic resins, siloxane-containing polyamide resins, siloxane-containing polyimides, siloxane-containing polyurethanes, siloxane-modified acrylates, siloxane-modified epoxies, silicone resins, and silicone diamines. The thermoplastic resin having a siloxane chain is preferably a polyimide having a siloxane chain (siloxane-containing polyimide) from the perspective of suppressing outgassing during heating and improving the heat resistance and the adhesion of the inter-wiring layer insulating layer.

The siloxane-containing polyimides may be synthesized, for example, by a reaction between siloxane diamine and tetracarboxylic acid dianhydride, or a reaction between siloxane diamine and bismaleimide.

The siloxane diamine preferably comprises a structure represented by the following formula (5):

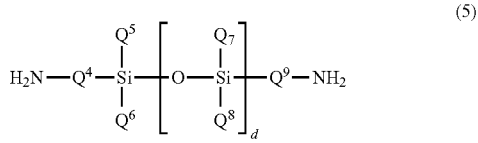

(5)

wherein $Q^4$ and $Q^9$ each independently represent an alkylene group having 1 to 5 carbon atoms or a phenylene group that may have a substituent, and $Q^5$, $Q^6$, $Q^7$ an $Q^8$ each independently represent an alkyl group having 1 to 5 carbon atoms, a phenyl group or a phenoxy group, and d represents an integer of 1 to 5.

Examples of the siloxane diamine with d being 1 in the formula (5) include 1,1,3,3-tetramethyl-1,3-bis(4-aminophenyl)disiloxane, 1,1,3,3-tetraphenoxy-1,3-bis(4-aminoethyl)disiloxane, 1,1,3,3-tetraphenyl-1,3-bis(2-aminoethyl)disiloxane, 1,1,3,3-tetraphenyl-1,3-bis(3-aminopropyl)disiloxane, 1,1,3,3-tetramethyl-1,3-bis(2-aminoethyl)disiloxane, 1,1,3,3-tetramethyl-1,3-bis(3-aminopropyl)disiloxane, 1,1,3,3-tetramethyl-1,3-bis(3-aminobutyl)disiloxane, and 1,3-dimethyl-1,3-dimethoxy-1,3-bis(4-aminobutyl)disiloxane.

Examples of the siloxane diamine with d being 2 in the formula (5) include 1,1,3,3,5,5-hexamethyl-1,5-bis(4-aminophenyl)trisiloxane, 1,1,5,5-tetraphenyl-3,3-dimethyl-1,5-bis(3-aminopropyl)trisiloxane, 1,1,5,5-tetraphenyl-3,3-dimethoxy-1,5-bis(4-aminobutyl)trisiloxane, 1,1,5,5-tetraphenyl-3,3-dimethoxy-1,5-bis(5-aminopentyl)trisiloxane, 1,1,5,5-tetramethyl-3,3-dimethoxy-1,5-bis(2-aminoethyl)trisiloxane, 1,1,5,5-tetramethyl-3,3-dimethoxy-1,5-bis(4-aminobutyl)trisiloxane, 1,1,5,5-tetramethyl-3,3-dimethoxy-1,5-bis(5-aminopentyl)trisiloxane, 1,1,3,3,5,5-hexamethyl-1,5-bis(3-aminopropyl)trisiloxane, 1,1,3,3,5,5-hexaethyl-1,5-bis(3-aminopropyl)trisiloxane, and 1,1,3,3,5,5-hexapropyl-1,5-bis(3-aminopropyl)trisiloxane.

Examples of commercially available products of siloxane diamine include "PAM-E" having amino groups at both ends (amino group equivalent: 130 g/mol), "KF-8010" (amino group equivalent: 430 g/mol), "X-22-161A" (amino group equivalent: 800 g/mol), "X-22-161B" (amino group equivalent: 1500 g/mol), "KF-8012" (amino group equivalent: 2200 g/mol), "KF-8008" (amino group equivalent: 5700 g/mol), "X-22-9409" (amino group equivalent: 700 g/mol, side chain phenyl type), "X-22-1660B-3" (amino group equivalent: 2200 g/mol, side chain phenyl type) (those mentioned above are manufactured by Shin-Etsu Chemical Co., Ltd.), "BY-16-853U" (amino group equivalent: 460 g/mol), "BY-16-853" (amino group equivalent: 650 g/mol), and "BY-16-853B" (amino group equivalent: 2200 g/mol) (those mentioned above are manufactured by Dow Corning Toray Co., Ltd.). The siloxane diamines described above may be used alone or as a mixture of two or more thereof. From the perspective of the reactivity with a maleimide group, it is preferable that at least any one of "PAM-E", "KF-8010", "X-22-161A", "X-22-161B", "BY-16-853U", and "BY-16-853" is used. From the perspective of dielectric properties, it is more preferable that at least any one of "PAM-E", "KF-8010", "X-22-161A", "BY-16-853U", and "BY-16-853" be used. From the perspective of the compatibility with varnish, it is preferable that at least any one of "KF-8010", "X-22-161A" and "BY-16-853" be used.

The content of the siloxane component in the siloxane-containing polyimide is, for example, 5 to 50% by mass in the perspective of the reactivity and compatibility, preferably 5 to 30% by mass from the perspective of the heat resistance, and more preferably 10 to 30% by mass from the perspective that the moisture absorptivity of the inter-wiring layer insulating layer can be further reduced, though not particularly limited thereto, based on the total mass of polyimide.

The other diamine component for use as a raw material of polyimide is not particularly limited, and examples thereof include aromatic diamines such as o-phenylenediamine, m-phenylenediamine, p-phenylenediamine, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenyl ether methane, bis(4-amino-3,5-dimethylphenyl)methane, bis(4-amino-3,5-diisopropylphenyl)methane, 3,3'-diaminodiphenyl difluoromethane, 3,4'-diaminodiphenyl difluoromethane, 4,4'-diaminodiphenyl difluoromethane, 3,3'-diaminodiphenyl sulfone, 3,4'-diaminodiphenyl sulfone, 4,4'-diaminodiphenyl sulfone, 3,3'-diaminodiphenyl sulfide, 3,4'-diaminodiphenyl sulfide, 4,4'-diaminodiphenyl sulfide, 3,3'-diamino diphenyl ketone, 3,4'-diamino diphenyl ketone, 4,4'-diamino diphenyl ketone, 2,2-bis(3-aminophenyl)propane, 2,2'-(3,4'- diaminodiphenyl)propane, 2,2-bis(4-aminophenyl)propane, 2,2-bis(3-aminophenyl)hexafluoropropane, 2,2-(3,4'-diaminodiphenyl)hexafluoropropane, 2,2-bis(4-aminophenyl) hexafluoropropane, 1,3-bis(3-aminophenoxy)benzene, 1,4-bis(3-aminophenoxy)benzene, 1,4-bis(4-aminophenoxy) benzene, 3,3'-(1,4-phenylene bis(1-methylethylidene)) bisaniline, 3,4'-(1,4-phenylene bis(1-methylethylidene)) bisaniline, 4,4'-(1,4-phenylene bis(1-methylethylidene)) bisaniline, 2,2-bis(4-(3-aminophenoxy)phenyl)propane, 2,2-bis(4-(3-aminophenoxy)phenyl)hexafluoropropane, 2,2-bis (4-(4-aminophenoxy)phenyl)hexafluoropropane, bis(4-(3-aminophenoxy)phenyl)sulfide, bis(4-(4-aminophenoxy) phenyl)sulfide, bis(4-(3-aminophenoxy)phenyl)sulfone, bis (4-(4-aminophenoxy)phenyl)sulfone, 3,3'-dihydroxy-4,4'-diaminobiphenyl, and 3,5-diaminobenzoic acid, 1,3-bis (aminomethyl)cyclohexane, 2,2-bis(4-aminophenoxyphenyl)propane, aliphatic ether diamines represented by the following formula (4), aliphatic diamines represented by the following formula (11), and diamines having a carboxyl group and/or a hydroxyl group in a molecule.

$$H_2N-Q^1+O-Q^2)_bO-Q^3-NH_2 \qquad (4)$$

In the formula, $Q^1$, $Q^2$ and $Q^3$ each independently represent an alkylene group having 1 to 10 carbon atoms, and b represents an integer of 2 to 80.

$$H_2N+CH_2)_cNH_2 \qquad (11)$$

In the formula, c represents an integer of 5 to 20.

Examples of the aliphatic ether diamine represented by the formula (4) include aliphatic diamines represented by the following formula:

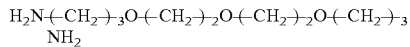
Mw=350

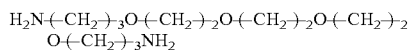
Mw=750

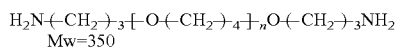
Mw=1100

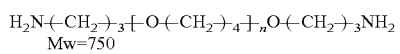
Mw=2100

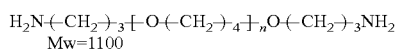
Mw=230

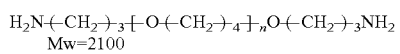
Mw=400

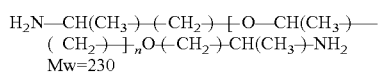
Mw=2000 wherein n represents an integer of 1 or more; and aliphatic ether diamines represented by the following formula (12):

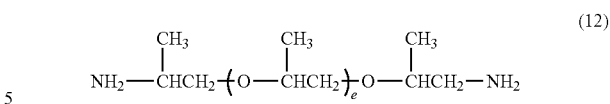

wherein e represents an integer of 0 to 80.

Specific examples of the aliphatic diamines represented by the formula (11) include 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, and 1,2-diaminocyclohexane.

The diamine components described above may be used alone or as a mixture of two or more thereof.

As the raw material of polyimides, for example, tetracarboxylic acid anhydride may be used. The acid anhydrides are not particularly limited, and examples thereof include pyromellitic acid dianhydride, 3,3',4,4'-biphenyltetracarboxylic acid dianhydride, 2,2',3,3'-biphenyltetracarboxylic acid dianhydride, 2,2-bis(3,4-dicarboxyphenyl)propane dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl) methane dianhydride, bis(3,4-dicarboxyphenyl)sulfone dianhydride, 3,4,9,10-perylenetetracarboxylic acid dianhydride, bis(3,4-dicarboxyphenyl)ether dianhydride, benzene-1,2,3,4-tetracarboxylic acid dianhydride, 3,4,3',4'-benzophenone tetracarboxylic acid dianhydride, 2,3,2',3'-benzophenone tetracarboxylic acid dianhydride, 3,3,3',4'-benzophenone tetracarboxylic acid dianhydride, 1,2,5,6-naphthalene tetracarboxylic acid dianhydride, 1,4,5,8-naphthalene tetracarboxylic acid dianhydride, 2,3,6,7-naphthalene tetracarboxylic acid dianhydride, 1,2,4,5-naphthalene tetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, phenanthrene-1,8,9,10-tetracarboxylic acid dianhydride, pyrazine-2,3,5,6-tetracarboxylic acid dianhydride, thiophene-2,3,5,6-tetracarboxylic acid dianhydride 2,3,3',4'-biphenyltetracarboxylic acid dianhydride, 3,4,3',4'-biphenyltetracarboxylic acid dianhydride, 2,3,2',3'-biphenyltetracarboxylic acid dianhydride, bis(3,4-dicarboxyphenyl)dimethylsilane dianhydride, bis(3,4-dicarboxyphenyl) methylphenylsilane dianhydride, bis(3,4-dicarboxyphenyl)diphenylsilane dianhydride, 1,4-bis(3,4-dicarboxyphenyl dimethylsilyl)benzene dianhydride, 1,3-bis (3,4-dicarboxyphenyl)-1,1,3,3-tetramethyl dicyclohexane dianhydride, p-phenylene bis(trimellitate anhydride), ethylene tetracarboxylic acid dianhydride, 1,2,3,4-butane tetracarboxylic acid dianhydride, decahydronaphthalene-1,4,5,8-tetracarboxylic acid dianhydride, 4,8-dimethyl-1,2,3,5,6,7-hexahydronaphthalene-1,2,5,6-tetracarboxylic acid dianhydride, cyclopentane-1,2,3,4-tetracarboxylic acid dianhydride, pyrrolidine-2,3,4,5-tetracarboxylic acid dianhydride, 1,2,3,4-cyclobutane tetracarboxylic acid dianhydride, bis(exo-bicyclo[2,2,1]heptane-2,3-dicarboxylic acid dianhydride, bicyclo-[2,2,2]-octo-7-ene-2,3,5,6-tetracarboxylic acid dianhydride, 2,2-bis(3,4-dicarboxyphenyl)propane dianhydride, 2,2-bis[4-(3,4-dicarboxyphenyl)phenyl] propane dianhydride, 2,2-bis(3,4-dicarboxyphenyl) hexafluoropropane dianhydride, 2,2-bis[4-(3,4- dicarboxyphenyl)phenyl]hexafluoropropane dianhydride, 4,4'-bis(3,4-dicarboxyphenoxy)diphenylsulfide dianhydride, 1,4-bis(2-hydroxy hexafluoroisopropyl)benzene bis(trimellitic acid anhydride), 1,3-bis(2-hydroxy hexafluoroisopropyl)benzene bis(trimellitic acid anhydride), 5-(2,5-dioxotetrahydrofuryl)-3-methyl-3-cyclohexene-1,2-dicarboxylic acid dianhydride, tetrahydorofuran-2,3,4,5-tetracarboxylic acid dianhydride, and tetracarboxylic acid dianhydrides represented by the following formula (7):

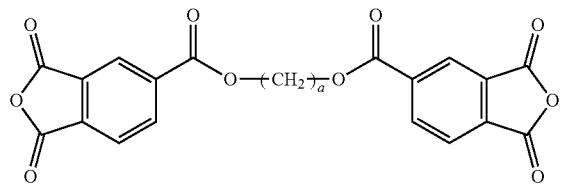

(7)

wherein a represents an integer of 2 to 20.

The tetracarboxylic acid dianhydride represented by the formula (7), can be synthesized, for example, from trimellitic acid anhydride monochloride and diols corresponding the same. Specific examples of the tetracarboxylic acid dianhydrides represented by the formula (7) include 1,2-(ethylene)bis(trimellitate anhydride), 1,3-(trimethylene)bis(trimellitate anhydride), 1,4-(tetramethylene)bis(trimellitate anhydride), 1,5-(pentamethylene)bis(trimellitate anhydride), 1,6-(hexamethylene)bis(trimellitate anhydride), 1,7-(heptamethylene)bis(trimellitate anhydride), 1,8-(octamethylene)bis(trimellitate anhydride), 1,9-(nonamethylene)bis(trimellitate anhydride), 1,10-(decamethylene)bis(trimellitate anhydride), 1,12-(dodecamethylene)bis(trimellitate anhydride), 1,16-(hexadecamethylene)bis(trimellitate anhydride), and 1,18-(octadecamethylene)bis(trimellitate anhydride).

The tetracarboxylic acid dianhydrides may comprise a tetracarboxylic acid dianhydride represented by the following formula (6) or (8), from the perspective of imparting good solubility in a solvent in the resin composition and moisture-proof reliability.

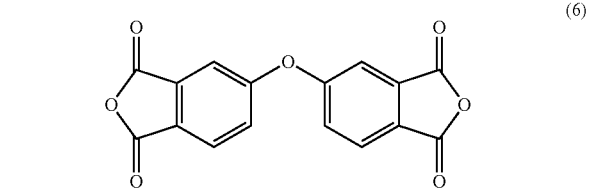

(6)

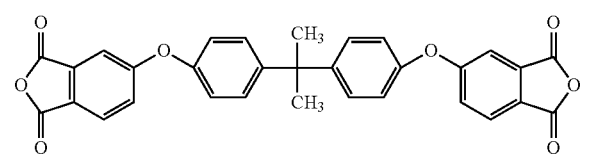

(8)

The tetracarboxylic acid dianhydrides described above may be used alone or as a mixture of two or more thereof.

As the raw material of polyimides, for example, bismaleimides may be used. The bismaleimides are not particularly limited, and examples thereof include bis(4-maleimide phenyl)methane, polyphenylmethane maleimide, bis(4-maleimide phenyl)ether, bis(4-maleimide phenyl)sulfone, 3,3-dimethyl-5,5-diethyl-4,4-diphenylmethane bismaleimide, 4-methyl-1,3-phenylene bismaleimide, m-phenylene bismaleimide, and 2,2-bis(4-(4-maleimide phenoxy)phenyl)propane.

The bismaleimides described above may be used alone or as a mixture of two or more thereof. The bismaleimide is preferably at least any one of bis(4-maleimide phenyl)methane, bis(4-maleimide phenyl)sulfone, 3,3-dimethyl-5,5-diethyl-4,4-diphenylmethane bismaleimide, and 2,2-bis(4-(4-maleimide phenoxy)phenyl)propane, from the perspective of having high reactivity and enabling the dielectric properties and wiring properties to be further improved. The bismaleimide is preferably at least any one of 3,3-dimethyl-5,5-diethyl-4,4-diphenylmethane bismaleimide, bis(4-maleimide phenyl)methane and 2,2-bis(4-(4-maleimide phenoxy)phenyl)propane, from the perspective of the solubility in solvent. The bismaleimide is preferably bis(4-maleimide phenyl)methane, from the perspective of availability at a low cost. The bismaleimide is preferably 2,2-bis(4-(4-maleimide phenoxy) phenyl)propane or "BMI-3000" (trade name) manufactured by Designer Molecules Inc., from the perspective of wiring properties.

The content of the thermoplastic resin may be 10% by mass to 70% by mass based on the mass of the resin composition (except for filler).

The thermosetting resin is not particularly limited so long as the resin composition is cured through the reaction with a curing agent by heating. The thermosetting resin may have a reactive functional group at a molecular end or in a molecular chain. Examples of the reactive functional groups include an epoxy group, a hydroxyl group, a carboxyl group, an amino group, an amide group, an isocyanate group, an acryloyl group, a methacryloyl group, a vinyl group, and a maleic acid anhydride group.

The thermosetting resin is preferably a thermosetting elastomer selected from styrene elastomers, olefin elastomers, urethane elastomers, polyester elastomers, polyamide elastomers, acrylic elastomers and silicone elastomers. These thermosetting elastomers comprise a hard segment component and a soft segment component. In general, the former contributes to the heat resistance and strength of the resin and the latter contributes to the flexibility and toughness of the resin. The thermosetting elastomers may be used alone or as a mixture of two or more thereof. The thermosetting elastomer is preferably at least any one of styrene elastomers, olefin elastomers, polyamide elastomers, and silicone elastomers, from the perspective of further improving the heat resistance and insulation reliability of the inter-wiring layer insulating layer, and more preferably at least any one of styrene elastomers and olefin elastomers, from the perspective of the dielectric properties of the inter-wiring layer insulating layer.

The thermosetting elastomer may have a reactive functional group at a molecular end or in a molecular chain. Examples of the reactive functional group include an epoxy group, a hydroxyl group, a carboxyl group, an amino group, an amide group, an isocyanate group, an acryloyl group, a methacryloyl group, a vinyl group, and a maleic acid anhydride group. The reactive functional group is preferably an epoxy group, an amino group, an acryloyl group, a methacryloyl group, a vinyl group, or a maleic acid anhydride group, from the perspective of compatibility and wiring properties, and more preferably, an epoxy group, an amino group, or a maleic acid anhydride group.

The content of the thermosetting elastomer is, for example, 10% by mass to 70% by mass based on the mass of the resin composition (except for filler), and preferably 20% by mass to 60% by mass from the perspective of dielectric properties and compatibility with varnish.

following formula (13), urethane acrylates or urethane methacrylates, urea acrylates, isocyanuric acid-modified di/tri-acrylates and methacrylates:

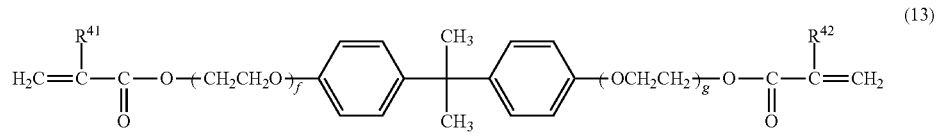

(13)

Examples of the curing agent include peroxides, imidazoles and derivatives thereof, organic phosphorus compounds, secondary amines, tertiary amines, and quaternary ammonium salts. The curing agent is preferably at least any one of peroxides, phosphorus products, and imidazoles, from the perspective of reactivity, and more preferably peroxides from the perspective of excellence in self-polymerization properties of maleimide groups.

The content of the curing agent may be different depending on types of the catalyst and the resin, or the applications of the resin composition. For example, in the case of a curing agent of peroxide, the content of the curing agent is preferably 0.1% by mass to 10% by mass, and more preferably 0.5% by mass to 5% by mass, still more preferably 0.75% by mass to 3% by mass, from the perspective of dielectric properties and handling properties of a film, based on the mass of the resin composition (except for filler).

The resin composition in the second embodiment may comprise an epoxy resin as thermosetting resin. The epoxy resin preferably comprises at least two or more epoxy groups in a molecule. The epoxy resin is more preferably a glycidyl ether of phenol from the perspective of curability and properties of a cured product. Examples of the resin include glycidyl ethers of bisphenol A (AD, S or F), glycidyl ethers of hydrogenated bisphenol A, glycidyl ethers of ethylene oxide adduct-bisphenol A, glycidyl ethers of propylene oxide adduct-bisphenol A, glycidyl ethers of phenol novolac resins, glycidyl ethers of cresol novolac resins, glycidyl ethers of bisphenol A novolac resins, glycidyl ethers of naphthalene resins, trifunctional (or tetra functional) glycidyl ethers, glycidyl ethers of dicyclopentadiene phenol resins, glycidyl esters of dimer acids, trifunctional (or tetrafunctional) glycidyl amines, and glycidyl amines of naphthalene resins. The epoxy resins may be used alone or as a mixture of two or more thereof.

The resin composition in the second embodiment may comprise a (meth)acrylate compound. Example of the (meth)acrylate compound include diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylol propane diacrylate, trimethylol propane triacrylate, trimethylol propane dimethacrylate, trimethylol propane trimethacrylate, 1,4-butanediol diacrylate, 1,6-hexanediol diacrylate, 1,4-butanediol dimethacrylate, 1,6-hexanediol dimethacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, styrene, divinylbenzene, 4-vinyltoluene, 4-vinylpyridine, N-vinylpyrrolidone, 2-hydroxyethyl acrylate, 2-hydroxyethyl methacrylate, 1,3-acryloyloxy-2-hydroxypropane, 1,2-methacryloyloxy-2-hydroxypropane, methylenebisacrylamide, N,N-dimethyl acrylamide, N-methylol acrylamide, triacrylates of tris(β-hydroxyethyl)isocyanurate, compounds represented by the following formula (13), urethane acrylates or urethane methacrylates, urea acrylates, isocyanuric acid-modified di/tri-acrylates and methacrylates:

wherein $R^{41}$ and $R^{42}$ each independently represent a hydrogen atom or a methyl group, and f and g each independently represent an integer of 1 or more.

The resin composition in the second embodiment may further contain an adhesion aid. Examples of the adhesion aid include silane coupling agents, triazole compounds, and tetraazole compounds.

As the silane coupling agent, compounds having a nitrogen atom are preferably used to improve the adhesion to metal. Examples of the silane coupling agent include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxy silyl-N-(1,3-dimethyl-butylidene)propylamine, N-phenyl-3-aminopropyltrimethoxysilane, tris-(trimethoxysilylpropyl)isocyanurate, 3-ureidopropyl trialkoxysilane, 3-isocyanate propyl triethoxysilane. The content of the silane coupling agent is preferably 0.1 parts by mass to 20 parts by mass based on the total solid content in the resin composition, from the perspectives of the effect of addition, heat resistance and producing cost.

Examples of the triazole compound include 2-(2'-hydroxy-5'-methylphenyl)benzotriazole, 2-(2'-hydroxy-3'-tert-butyl-5'-methylphenyl)-5-chlorobenzotriazole, 2-(2'-hydroxy-3',5'-di-tert-amylphenyl)benzotriazole, 2-(2'-hydroxy-5'-tert-octylphenyl)benzotriazole, 2,2'-methylenebis[6-(2H-benzotriazol-2-yl)-4-tert-octylphenol], 6-(2-benzotriazolyl)-4-tert-octyl-6'-tert-butyl-4'-methyl-2,2'-methylene bisphenol, 1,2,3-benzotriazole, 1-[N,N-bis(2-ethylhexyl)aminomethyl benzotriazole, carboxybenzotriazole, 1-[N,N-bis(2-ethylhexyl)aminomethyl]methyl benzotriazole, and 2,2'-[[(methyl-1H-benzotriazole-1-yl)methyl]imino]bisethanol.

Examples of the tetrazole compound include 1H-tetrazole, 5-amino-1H-tetrazole, 5-methyl-1H-tetrazole, 5-phenyl-1H-tetrazole, 1-methyl-5-ethyl-1H-tetrazole, 1-methyl-5-mercapto-1H-tetrazole, 1-phenyl-5-mercapto-1H-tetrazole, 1-(2-dimethylaminoethyl)-5-mercapto-1H-tetrazole, 2-methoxy-5-(5-trifluoromethyl-1H-tetrazol-1-yl)-benzaldehyde, 4,5-di(5-tetrazolyl)-[1,2,3]triazole, and 1-methyl-5-benzoyl-1H-tetrazole.

The content of the triazole compound and the tetrazole compound is preferably 0.1 parts by mass to 20 parts by mass based on the total solid content in the resin composition, from the perspectives of the effect of addition, the heat resistance and the production cost, respectively.

The silane coupling agent, the triazole compound and the tetraazole compound may be used alone or in combination thereof.

The resin composition in the second embodiment may further contain an ion scavenger. Through adsorption of ionic impurities in the resin composition by an ion scavenger, the inter-wiring layer insulating layer can have further improved insulation reliability when moisture is absorbed.

Examples of the ion scavenger include triazine thiol compounds, phenol reducing agents, or powdered inorganic compounds of bismuth, antimony, magnesium, aluminum, zirconium, calcium, titanium, or tin, and mixtures of the inorganic compounds. The triazine thiol compound and a phenolic reducing agent are compounds known as copper inhibitors for preventing copper from being ionized and leaking out.

Examples of the ion scavenger include inorganic ion scavengers (manufactured by Toagosei Co., Ltd., trade names: IXE-300 (antimony), IXE-500 (bismuth), IXE-600 (mixture of antimony and bismuth), IXE-700 (mixture of magnesium and aluminum), IXE-800 (zirconium) and IXE-1100 (calcium)). The ion scavengers may be used alone or as a mixture of two or more thereof. The content of the ion scavenger is preferably 0.01 parts by mass to 10 parts by mass based on the total solid content of the resin composition, from the perspectives of effect of the addition, heat resistance and production cost.

Hereinafter, matters common to the first embodiment and the second embodiment are described. The resin composition may further comprise a filler (filling material) from the perspective of imparting a low moisture absorbing properties and low moisture permeability. The filler may be an inorganic filler made of inorganic material, or an organic filler made of organic material. These fillers are preferably insulating fillers.

Examples of the inorganic filler include alumina, aluminum hydroxide, magnesium hydroxide, calcium carbonate, magnesium carbonate, calcium silicate, magnesium silicate, calcium oxide, magnesium oxide, aluminum oxide, aluminum nitride, crystalline silica, amorphous silica, boron nitride, titania, glass, iron oxide, and ceramics. Examples of the organic filler include carbon and rubber fillers. The fillers may be used without any particular limitation, regardless of the type and shape.

A different filler may be used depending on the desired function. For example, inorganic fillers are added to impart thermal conductivity, low thermal expansion properties, and low moisture absorbing properties to the inter-wiring layer insulating layer. Organic fillers are added to impart, for example, toughness to the inter-wiring layer insulating layer. The filler may include at least one of inorganic fillers and organic fillers. The fillers may be used alone or in combination of two or more thereof. The filler is preferably an inorganic filler, from the perspective of capability of imparting thermal conductivity, low moisture absorption properties, and insulating properties required for an inter-wiring layer insulating layer, and more preferably at least any one of silica filler and alumina filler from the perspectives of having good dispersibility in resin varnish, and capability to impart high adhesive force during heating.

The average particle diameter of the filler is, for example, 10 μm or less, and the maximum particle diameter of the filler is, for example, 30 μm or less. It is preferable that the average particle diameter of the filler be 5 μm or less, and the maximum particle diameter of the filler be 20 μm or less. With an average particle diameter of 10 μm or less and a maximum particle diameter of 30 μm or less, an improved effect of fracture toughness of the inter-wiring layer insulating layer can be well exhibited, and the reduction and variation in adhesion strength of the inter-wiring layer insulating layer can be suppressed. Further, the surface of the inter-wiring layer insulating layer is roughened, so that reduction in the adhesive strength can be also suppressed. The lower limit of the average particle diameter of the filler and the lower limit of the maximum particle diameter are not particularly limited, and both may be 0.001 μm or more.

Examples of the method for measuring the average particle diameter and the maximum particle diameter of the filler include a method for measuring the particle diameter of about 20 pieces of the filler using a scanning electron microscope (SEM). Examples of the measurement method using an SEM include a method including the steps of heat-curing a filler-containing resin composition (preferably at 150 to 180° C. for 1 to 10 hours) to prepare a sample, cutting the central part of the sample, and observing the cross section by an SEM. On this occasion, it is preferable that the existence probability of the filler having a particle diameter of 30 μm or less in the cross section be 80% or more in the entire filler.

The content of the filler is appropriately determined corresponding to the properties or the function to be imparted. For example, the content of the filler is preferably 1% by mass to 70% by mass, or 2% by mass to 60% by mass, more preferably 5% by mass to 50% by mass, based on the mass of the resin composition. By increasing the content of the filler, a higher elastic modulus of the inter-wiring layer insulating layer is achieved. Thereby, dicing properties (cuttability by a dicer blade), wire bonding properties (ultrasonic efficiency), and adhesion strength during heating can be effectively improved. It is preferable that the content of the filler be at the upper limit or less from the perspective of suppressing reduction in thermocompression bonding properties. The optimum filler content may be determined to balance the properties required. The mixing and kneading of the filler may be performed through an appropriate combination of dispersers such as a normal stirrer, a grinder, a triple roll, and a ball mill.

The resin composition may further contain an antioxidant from the perspectives of storage stability, prevention of electromigration, and prevention of corrosion of a metal conductor circuit. The antioxidant is not particularly limited, and examples thereof include benzophenone, benzoate, hindered amine, benzotriazole, and phenol antioxidants. The content of the antioxidant is preferably 0.01 parts by mass to 10 parts by mass based on 100 parts by mass of the resin component, from the perspectives of effect of the addition, heat resistance and cost.

The resin composition may further contain a catalyst to further accelerate curing. Examples of the catalyst include peroxides, imidazole compounds, organic phosphorus compounds, secondary amines, tertiary amines and quaternary ammonium salts. These may be used alone or in combination of two or more thereof. The catalyst is preferably at least one selected from the group consisting of peroxides, imidazole compounds and organic phosphorus compounds from the perspectives of reactivity, and more preferably peroxides particularly from the perspective of contribution to self-polymerization properties of the maleimide group and to the reaction between the maleimide group and the acryloyl group.

The resin composition may further contain a flame retardant. The flame retardant is not particularly limited, and examples thereof include halogen-containing flame retardants such as bromine flame retardants and chlorine flame retardants, phosphorus flame retardants such as triphenyl phosphate, tricresyl phosphate, tris-dichloropropyl phosphate, phosphate compounds, and red phosphorus, a nitrogen-based flame retardant such as guanidine sulfamate, melamine sulfate, melamine polyphosphate and melamine cyanurate, phosphazene flame retardants such as cyclophosphazene and polyphosphazene, and inorganic flame retardants such as antimony trioxide. One of these flame retardants may be used alone or two or more thereof may be used in combination.

The resin composition may further contain an ultraviolet absorber. Examples of the ultraviolet absorber include benzotriazole ultraviolet absorbers, though not particularly limited thereto.

The resin composition may further contain a fluorescent whitening agent. Examples of the fluorescent whitening agent include stilbene derivatives, though not particularly limited thereto.

The resin composition is preferably in a film form, from the perspective of handling properties. The resin composition may be a varnish (in a liquid form), with each component being dissolved or uniformly dispersed in a solvent (liquid).

The means, conditions, etc., for preparing the varnish are not particularly limited. Examples of the method include successive steps of sufficiently uniformly stirring and mixing principal components in respective predetermined blending amounts, kneading the mixture with a mixing roll, an extruder, a kneader, a roll, or an extruder, and further cooling and pulverizing the resulting kneaded product. The kneading method is not particularly limited.

When the resin composition is a varnish, the solvent may be, for example, an organic solvent. The organic solvent is not particularly limited, and examples thereof include alcohols such as methanol, ethanol, butanol, butyl cellosolve, ethylene glycol monomethyl ether, propylene glycol monomethyl ether; ketones such as acetone, methyl ethyl ketone, methyl isobutyl ketone, cyclohexanone and cyclopentanone; aromatic hydrocarbons such as toluene, xylene, mesitylene and limonene; esters such as methoxyethyl acetate, ethoxyethyl acetate, butoxyethyl acetate and ethyl acetate; and nitrogen-containing compounds such as N,N-dimethylformamide, N,N-dimethylacetamide and N-methyl-2-pyrrolidone. These may be used alone or as a mixture of two or more thereof. The organic solvent is preferably toluene, xylene, cyclohexanone, and cyclopentanone, limonene or mesitylene, from the perspective of solubility, more preferably cyclopentanone, limonene or mesitylene from the perspective of low toxicity.

It is preferable that the organic solvent be used in an amount such that the solid content of the resin composition in the varnish is 5 to 90% by mass, more preferably in an amount such that the solid content is 10 to 60% by mass from the perspective of maintaining good handling properties and application/coating properties of the varnish.

The cured product of the resin composition has a moisture absorptivity of preferably 1% by mass or less, after placed in an atmosphere at 130° C. and a relative humidity of 85% for 200 hours.

The moisture absorptivity of a cured product of the resin composition after placed in an environment at 130° C. and a relative humidity of 85% for 200 hours can be measured by the following procedure. A curable film of the resin composition with a film thickness of 10 μm is laminated on a silicon wafer at 100° C., and the curable film in this state is cured by heating at 180° C. for 2 hours. The sample as a laminate of the silicon wafer and the cured film of the resin composition is left to stand in a constant temperature and humidity chamber at 130° C. and relative humidity of 85% (EHS-221MD manufactured by ESPEC Corp.) for 200 hours. The sample is taken out after the temperature of the constant temperature and humidity chamber is lowered to 50° C., and the cured film is scraped off from the silicon wafer. The weight loss of the resulting cured product sample by heating is measured with a differential thermogravimetric simultaneous analysis apparatus (trade name "TG/DTA6300", manufactured by SII Nano Technologies Inc.), under conditions of a temperature rising rate of 10° C./min and a nitrogen flow of 400 mL/min at a temperature of 25 to 150° C. The mass reduction ratio at the time of heating to 150° C. (the ratio relative to the mass of the cured product sample before measurement) is recorded as moisture absorptivity (mass %).

It is preferable that the content of chloride ions in the cured product of the resin composition be 5 ppm or less from the perspective of insulation reliability, and it is more preferable that the content be 3 ppm or less from the perspective of capability to suppress the discoloration of copper wiring. The content of chloride ions can be measured by the following procedure. In a heat-resistant container made of Teflon (registered trade mark), 1 g of the cured sample and 10 g of ultrapure water as extract are placed to be heated at 130° C. for 5 hours. The extract is then filtered to be analyzed by ion chromatography. In the resulting chromatogram, the peaks detected in an elution time of 0 to 30 minutes are regarded as the total amount of eluate, and from the peak area of the chloride ions in the vicinity of 9.6 minutes, the mass of chloride ions in the cured product sample is obtained. The ratio of the resulting mass of the chloride ions to the mass of the cured product sample is calculated as the content of chloride ions (ppm) in the cured product.

Herein, the conditions of the ion chromatography are as follows:
Apparatus: ISC-2000, manufactured by Dionex
Detector: Electrical conductivity detector
Column: AS20 (diameter: 4 mm, length: 200 mm)
Column temperature: 30° C.
Flow rate: 1.0 ml/min
Injection volume: $25_1 11$
Gradient setting: The KOH content is set to 5 mM at 0 min, 5 mM at 5 min, 30 mM at 15 min, and 55 mM at 20 min.

It is preferable that the dielectric constant at 10 GHz of the inter-wiring layer insulating layer (cured product of the resin composition) be 3.6 or less, 3.2 or less, or 3.0 or less from the perspective of capability to suppress crosstalk between wiring layers, and it is more preferable that the dielectric constant be 2.8 or less from the perspective of capability to further improve the reliability of electrical signals. The dielectric constant may be 1.0 or more. The dielectric constant can be measured by using a sample piece obtained through the steps of curing the resin composition by heating at 180° C. for 2 hours to prepare a cured product having a thickness of 300 μm, and cutting the cured product into a length of 60 mm and a width of 2 mm to be vacuum-dried at 30° C. for 6 hours.

It is preferable that the dielectric loss tangent at 10 GHz of the inter-wiring layer insulating layer (cured product of the resin composition) be 0.012 or less, 0.008 or less, or 0.005 or less. The dielectric loss tangent may be 0.0001 or more. The dielectric loss tangent can be calculated from the resonance frequency and the unloaded Q values obtained at 10 GHz. The measurement temperature is 25° C. As the measuring apparatus of the dielectric constant and the dielectric loss tangent, for example, a vector network analyzer (trade name: E8364B, manufactured by Keysight Technologies Inc.) and a 10-GHz resonator (trade name: CP531, manufactured by Kanto Electronic Application and Development Inc.) are used with CPMA-V2 as a program.

It is preferable that the glass transition temperature of the cured product of the resin composition be 120° C. or more from the perspective of suppressing cracking during temperature cycles, and it is more preferable that the glass transition temperature be 140° C. or more from the perspective of capability to ease the stress applied to the wiring. It is preferable that the glass transition temperature of the cured product of the resin composition be 240° C. or less from the perspective of laminating at low temperature, and it is more preferable that the glass transition temperature be 220° C. or less from the perspective of suppressing the curing shrinkage. The glass transition temperature of the cured product of the resin composition may be 120 to 240° C., 120 to 220° C., 140 to 240° C., or 140 to 220° C.

The glass transition temperature of the cured product of the resin composition is measured by using a sample obtained through the steps of curing the resin composition by heating at 180° C. for 2 hours to prepare a cured product having a thickness of 300 μm, and cutting the cured product into a length of 30 mm and a width of 4 mm. The measurement is performed by using a dynamic viscoelasticity measuring apparatus manufactured by UBM K.K., at a distance between chucks of 20 mm, a frequency of 10 Hz, and a temperature rising rate of 5° C./min, in the temperature range of 40 to 260° C., and the temperature at which tan δ exhibits the maximum value is recorded as the glass transition temperature.

The elongation at fracture of a cured product of the resin composition is, for example, 5% or more, from the perspective of capability to reduce the warpage of the inter-wiring layer insulating layer. It is preferable that the elongation at fracture be 10% or more, from the perspective of easing the stress applied to the copper wiring. It is more preferably that the elongation at fracture be 15% or more from the perspective of capability to improve the temperature cycle reliability of the wiring layer laminate. The elongation at fracture may be 200% or less. The elongation at fracture of a cured product of the resin composition may be 5 to 200%, 10 to 200%, or 15 to 200%. The elongation at fracture can be measured by using a sample prepared through the steps of curing the resin composition by heating at 180° C. for 2 hours to prepare a cured product having a thickness of 300 μm, and cutting the cured product into a length of 30 mm and a width of 5 mm. The elongation at fracture is measured by a small table-top testing machine (trade name: EZ-S, manufactured by Shimadzu Corporation) with a feed rate set at 5 mm/min.

The 5% weight loss temperature of a cured product of the resin composition is, for example, 300° C. or more, from the perspective of heat resistance reliability. The 5% weight loss temperature of the first inter-wiring layer insulating layer 17 can be measured by using a sample cured product having a thickness of 300 μm obtained through curing the resin composition by heating at 180° C. for 2 hours, with a differential thermogravimetric simultaneous analysis apparatus (trade name "TG/DTA6300", manufactured by Hitachi High-Tech Science Corporation), under conditions of a temperature rising rate of 10° C./min and a nitrogen flow of 400 mL/min.

The storage modulus of a cured product of the resin composition at 40° C. may be 10 MPa to 5 GPa.

FIG. 1 is a schematic cross-sectional view of a semiconductor package having a wiring layer laminate for a semiconductor in an embodiment. It is preferable that the wiring layer laminate for a semiconductor of the present disclosure be used in a package form which requires an interposer with different types of chips mix-loaded.

As shown in FIG. 1, the semiconductor package 100 comprises a substrate 1, a wiring layer laminate 10 disposed on the substrate 1, and semiconductor chips 2A and 2B mounted on the wiring layer laminate 10. The semiconductor chips 2A and 2B are fixed on the wiring layer laminate 10 with corresponding underfills 3A and 3B, respectively, and electrically connected to each other through a surface wiring (not shown in drawing) disposed in the wiring layer laminate 10. The substrate 1 is a sealed product made by sealing semiconductor chips 2C and 2D and electrodes 5A and 5B with an insulating material 4. The semiconductor chips 2C and 2D in the substrate 1 are connectable to an external device via electrodes exposed from the insulating material 4. The electrodes 5A and 5B function, for example, as conductive paths for the wiring layer laminate 10 and the external device to be electrically connected to each other.

Each of the semiconductor chips 2A to 2D, for example, is a volatile memory such as a Graphics Processing Unit (GPU), a Dynamic Random Access Memory (DRAM) or a Static Random Access Memory (SRAM), a nonvolatile memory such as a flash memory, an RF chip, a silicon photonic chip, a Micro Electro Mechanical System (MEMS), and a sensor chip. The semiconductor chips 2A to 2D may have a TSV. As each of the semiconductor chips 2A to 2D, for example, one in which semiconductor elements are laminated may also be used. In this case, semiconductor elements laminated with a TSV may be used. The thickness of the semiconductor chips 2A and 2B is, for example, 200 μm or less. It is preferable that the thickness of the semiconductor chips 2A and 2B be 100 μm or less, from the perspective of thinning the semiconductor package 100. Further, from the perspective of handling properties, it is more preferable that the thickness of the semiconductor chips 2A and 2B be 30 μm or more. Each of the semiconductor chips 2A to 2D is electrically connected to any one of the wirings in the wiring layer laminate 10.

The underfills 3A and 3B are, for example, capillary underfills (CUF), mold underfills (MUF), paste underfills (NCP), film underfills (NCF), or photosensitive underfills. Underfills 3A and 3B are mainly composed of liquid curable resins (e.g., epoxy resin) respectively. The insulating material 4 is, for example, a curable resin having insulating properties.

The wiring layer laminate 10 in the present embodiment is described in detail with reference to FIG. 2 as follows. The wiring layer laminate 10 is a wiring substrate on which semiconductor elements or the like are mounted. The shape of the wiring layer laminate 10 corresponds to the shape of the substrate 11 to be described below, and may be in a wafer form (approximately a circular form in the plan view) or a panel form (approximately rectangular form in the plan view).

Figure 2:
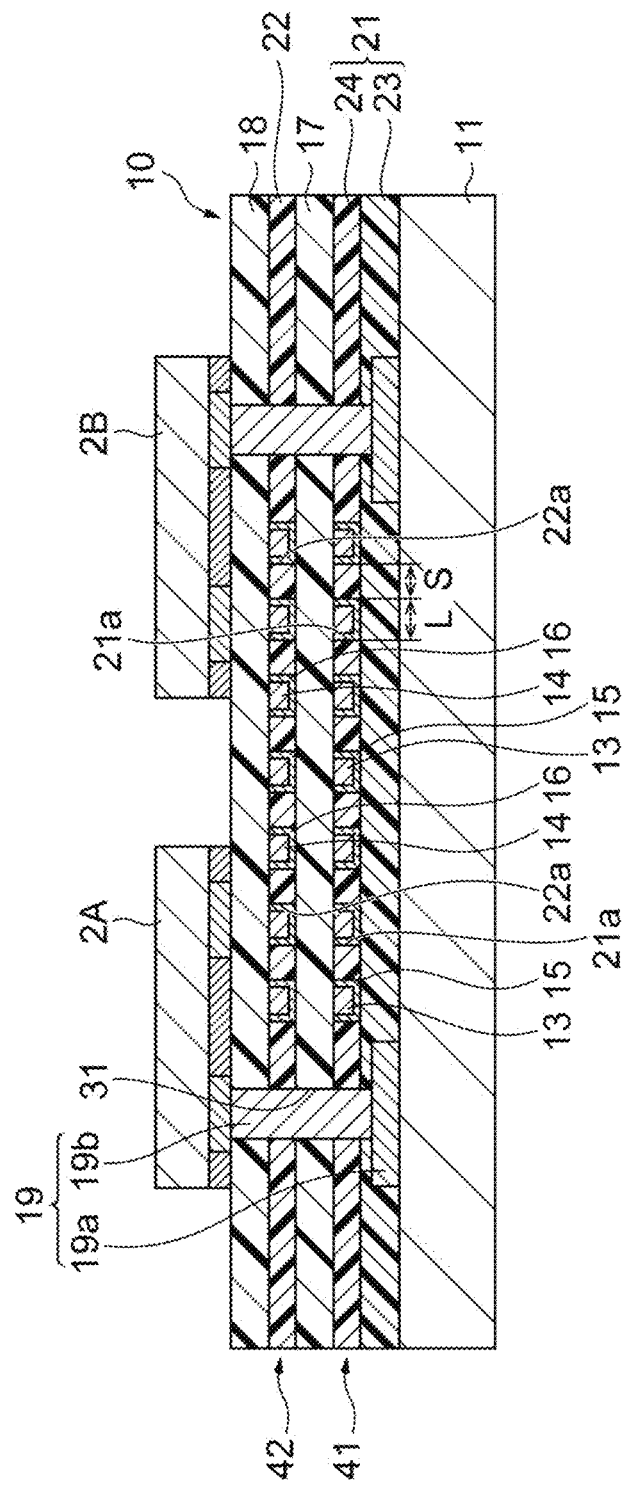
FIG. 2 is a schematic cross-sectional view of a wiring layer laminate for a semiconductor in an embodiment.

The wiring layer laminate 10 disposed on the substrate 11 shown in FIG. 2 comprises a plurality of wiring layers 41 and 42 which comprise organic insulating layers 21 and 22, copper wirings 13 and 14 embedded in the organic insulating layers 21 and 22, and barrier metal films 15 and 16 disposed between the copper wirings 13 and 14 and the organic insulating layers 21 and 22, respectively, inter-wiring layer insulating layers 17 and 18 adjacent to the wiring layers 41 and 42, and a through wiring 19 passing through the organic insulating layers 21 and 22 and the inter-wiring layer insulating layers 17 and 18. The organic insulating layers 21 and 22 and the inter-wiring layer insulating layers 17 and 18 are alternately laminated on the substrate 11. A part of the surfaces of the copper wirings 13 and 14 is exposed to a principal surface side of one of the wiring layers 41 and 42, and the exposed surfaces of the copper wiring 13 and 14 are in contact with the inter-wiring layer insulating layers 17 and 18. The inter-wiring layer insulating layers 17 and 18 are cured products of the curable resin composition in the embodiment described above. The organic insulating layers 21 and 22 may be layers formed of photosensitive insulating resin. The copper wiring may be exposed to both of the principal surfaces of the wiring layer, and the surface of the exposed copper wiring may be in contact with the inter-wiring layer insulating layer.

The substrate 11 is a support which supports the wiring layer laminate 10. The shape of the substrate 11 in the plan view is, for example, in a circular form or a rectangular form. In the case of a circular form, the substrate 11 has a diameter of, for example, 200 mm to 450 mm. In the case of a rectangular form, one side of the substrate 11 is, for example, 300 mm to 700 mm.

The substrate 11 is, for example, a silicon substrate, a glass substrate, or a peelable copper foil. The substrate 11 may be, for example, a build-up substrate, a substrate for wafer-level packaging, a coreless substrate, a substrate made by thermally curing encapsulating material, or a substrate with sealed or embedded chips. When a silicon substrate, a glass substrate, or the like is used as the substrate 11, a temporary fixing layer (not shown in drawing) may be disposed to temporarily fix the wiring layer laminate 10 and the substrate 11. In this case, by removing the temporary fixing layer, the substrate 11 can be easily peeled off from the wiring layer laminate 10. The peelable copper foil is a laminate with a support, a release layer, and a copper foil stacked in this order. In the peelable copper foil, the support corresponds to the substrate 11, and the copper foil may constitute a part of the through wiring 19.

The organic insulating layer 21 (first organic insulating layer) comprises a third organic insulating layer 23 positioned adjacent to the substrate 11, and a fourth organic insulating layer 24 positioned adjacent to the second organic insulating layer 22. The first organic insulating layer 21 has a plurality of grooves 21a (first grooves) in which corresponding copper wirings 13 are disposed. The fourth organic insulating layer 24 is provided with a plurality of openings corresponding to the grooves 21a. The surface of the third organic insulating layer 23 exposed through these openings constitutes a bottom face at the inner surface of the groove 21a. The side of the groove 21a is made of the fourth organic insulating layer 24.

The third organic insulating layer 23 and the fourth organic insulating layer 24 each have a thickness of, for example, 0.5 µm to 10 µm. Accordingly, the thickness of the first organic insulating layer 21 is, for example, 1 µm to 20 µm. Having a thickness of 1 µm or more, the first organic insulating layer 21 contributes to the stress relaxation of the wiring layer laminate 10, so that the thermal cycle resistance of the wiring layer laminate 10 may be improved. Having a thickness of 20 µm or less, the first organic insulating layer 21 suppresses the warpage of the wiring layer laminate 10, so that, for example, the wiring or the like can be easily exposed when the wiring layer laminate 10 is ground. From the perspective of forming a copper wiring having a width of 3 µm or less of the copper wiring 13 through exposure and development, it is preferable that the thickness of the first organic insulating layer 21 be 15 µm or less, and it is more preferable that the thickness be 10 µm or less.

A plurality of grooves 21a is provided in the surface of the first organic insulating layer 21 on the opposite side of the substrate 11. The cross section of each of the grooves 21a along the direction perpendicular to the extending direction of the grooves 21a has an approximately rectangular form. The inner surface of the groove 21a, therefore, has a side face and a bottom face. Further, a plurality of grooves 21a has a predetermined line width L and a space width S. Each of the line width L and the space width S is, for example, 0.5 µm to 10 µm, preferably 0.5 µm to 5 µm, more preferably 2 µm to 5 µm. From the perspective of enabling the wiring layer laminate 10 to achieve the high-density transmission, it is preferable that the line width L be 1 µm to 5 µm. The line width L and the space width S may be set to be equal to each other, or may be set to be different from each other. The line width L corresponds to the width of the groove 21a in the direction perpendicular to the extending direction of the groove 21a in the plan view. The space width S corresponds to the distance between the grooves 21a adjacent to each other. The depth of the groove 21a corresponds to, for example, the thickness of the fourth organic insulating layer 24.

The organic insulating layer 22 (second organic insulating layer) is laminated on the first organic insulating layer 21 to sandwich the inter-wiring layer insulating layer 17 (first inter-wiring layer insulating layer). The second organic insulating layer 22 has a plurality of grooves 22a (second grooves) in which corresponding copper wirings 14 are disposed.

The thickness of the second organic insulating layer 22 is, for example, 1 µm to 10 µm. Having a thickness of 1 µm or more, the second organic insulating layer 22 contributes to the stress relaxation of the wiring layer laminate 10, so that the thermal cycle resistance of the wiring layer laminate 10 may be improved. Having a thickness of 10 µm or less, the second organic insulating layer 22 suppresses the warpage of the wiring layer laminate 10, so that, for example, the wiring or the like can be easily exposed when the wiring layer laminate 10 is ground. A part of the second organic insulating layer 22 is provided with a plurality of openings corresponding to the grooves 22a. The surface of the first inter-wiring layer insulating layer 17 exposed through these openings constitutes a bottom face at the inner surface of the groove 22a. Each of the sides of the groove 22a is made of the second organic insulating layer 22. In the present embodiment, the line width and the space width of the grooves 22a are identical with the line width L and the space width S of the grooves 21a.

Each of the first organic insulating layer 21 having the grooves 21a and the second organic insulating layer 22 having the grooves 22a may be cured by heat treatment. The heat treatment is performed, for example, by using an oven. From the perspective of reducing the residual stress of the wiring layer laminate 10, it is preferable to perform the heat treatment, for example, at 200° C. or less. From the perspective of production efficiency, it is preferable to set the heating time to less than 3 hours.

The copper wiring 13 is disposed in the corresponding groove 21a as described above, so as to function as a conductive path in the internal part of the wiring layer laminate 10. The width of the copper wiring 13 is, therefore, approximately identical to the line width L of the groove 21a, and the distance between the copper wirings 13 adjacent to each other is approximately identical to the space width S of the groove 21a.

The copper wiring 14 is disposed in the corresponding groove 22a as described above so as to function as a conductive path in the internal part of the wiring layer laminate 10. The width of the copper wiring 13 is, therefore, approximately identical to the line width of the groove 22a, and the distance between the copper wirings 14 adjacent to each other is approximately identical to the space width of the groove 22a. The copper wiring 14 contains the same metal material as that of the copper wiring 13.

The barrier metal film 15 (first barrier metal layer) is a metal film disposed to make a partition between the copper wiring 13 and the first organic insulating layer 21 (i.e., the inner surface of the groove 21a). A first barrier metal film 15 is a film for preventing the diffusion of copper from the copper wiring 13 to the first organic insulating layer 21, spreading along the inner surface of the groove 21a. The first barrier metal film 15, therefore, comprises a metal material hardly diffusing into the organic insulating layer (e.g., titanium, chromium, tungsten, palladium, nickel, gold, tantalum and an alloy containing these). The first barrier metal film 15 may include one or more metals. From the perspective of adhesion to the inner surface of the groove 21a, it is preferable that the first barrier metal film 15 be a titanium film or an alloy film comprising titanium. When the first barrier metal film 15 is formed by sputtering, it is preferable that the first barrier metal film 15 be a titanium film, a tantalum film, a tungsten film, a chromium film, or an alloy film comprising at least any one of titanium, tantalum, tungsten and chromium.

The thickness of the first barrier metal film 15 is less than a half of the width of the groove 21a and less than the depth of the groove 21a. From the perspectives of preventing the copper wirings 13 from being conductive to each other and suppressing the increase in resistance, the thickness of the first barrier metal film 15 is, for example, 0.001 μm to 0.5 μm. From the perspective of preventing the metal material from diffusing in the copper wiring 13, it is preferable that the thickness of the first barrier metal film 15 be 0.01 μm to 0.5 μm. From the perspectives of the flatness of the first barrier metal film 15 and increasing the amount of electric current in the copper wiring 13, it is preferable that the thickness of the first barrier metal film 15 be 0.001 μm to 0.3 μm. As described above, it is most preferable that the thickness of the first barrier metal film 15 be 0.01 μm to 0.3 μm.

The second barrier metal film 16 is a metal film to make a partition between the copper wiring 14 and the second organic insulating layer 22 (i.e., the inner surface of the groove 22a). The second barrier metal film 16 is a film formed along the inner surface of the groove 22a so as to prevent copper from diffusing to the second organic insulating layer 22 from the copper wiring 14. The second barrier metal film 16, therefore, comprises a metal material hardly diffusing into the organic insulating layer as is the case with the first barrier metal film 15. The thickness of the second barrier metal film 16 is less than a half of the width of the groove 22a and less than the depth of the groove 22a as is the case with the first barrier metal film 15. Accordingly, the thickness of the second barrier metal film 16 is, for example, 0.001 μm to 0.5 μm, preferably 0.01 μm to 0.5 μm, or 0.001 μm to 0.3 μm, and most preferably 0.01 μm to 0.3 μm.

The first inter-wiring layer insulating layer 17 is an insulating film for preventing copper from diffusing to the first organic insulating layer 21 and the second organic insulating layer 22 from the copper wiring 13. The first inter-wiring layer insulating layer 17 is disposed between a wiring layer 41 (first wiring layer) and a wiring layer 42 (second wiring layer), so as to make a partition between the copper wiring 13 and the second organic insulating layer 22. The first inter-wiring layer insulating layer 17 is in contact with the surface of the copper wiring 13 exposed to the principal surface of the first wiring layer 41 on the opposite side of the substrate 11. From the perspective of capability to thin the wiring layer laminate 10, the thickness of the first inter-wiring layer insulating layer 17 is, for example, 50 μm or less. From the perspective of preventing the copper wirings 13 from being conductive to each other, the thickness of the first inter-wiring layer insulating layer 17 is, for example, 1 μm or more, preferably 10 μm or more. From the perspective of the surface smoothness of the first inter-wiring layer insulating layer 17, it is preferable that the thickness of the first inter-wiring layer insulating layer 17 be 30 μm or less. The material contained in the first inter-wiring layer insulating layer 17 and details of other properties of the first inter-wiring layer insulating layer 17 are described below.

The second inter-wiring layer insulating layer 18 is an insulating film for preventing diffusion of copper to the second organic insulating layer 22 from the copper wiring 14. The second inter-wiring layer insulating layer 18 disposed on the second wiring layer 42, is in contact with the surface of the copper wiring 14 exposed to the principal surface of the second wiring layer 42 on the opposite side of the substrate 11. The second inter-wiring layer insulating layer 18 comprises a material similar to that of the first inter-wiring layer insulating layer 17, and has properties similar to those of the first inter-wiring layer insulating layer 17.

The through wiring 19 is a wiring embedded in a via 31 passing through the wiring layers 41 and 42, and the inter-wiring layer insulating layers 17 and 18, functioning as a connection terminal to an external device.

The method for producing the wiring layer laminate 10 in the present embodiment is described as follows with reference to FIGS. 3 to 10. The wiring layer laminate 10 formed by the following production method, is particularly suitable, for example, in the form requiring micronizing and multi-pinning FIG. 4 (b) is an enlarged view of the main part of FIG. 4 (a). Similarly, FIG. 5 (b), FIG. 6 (b), FIG. 7 (b), FIG. 8 (b), FIG. 9 (b), FIG. 10 (b), FIG. 11 (b), and FIG. 12 (b) each are enlarged views of the main part of the corresponding Figures.

First, as shown in FIG. 3 (a), the bottom 19a of the through wiring is formed on the substrate 11 as a first step. The bottom 19a of the through wiring is formed by patterning a metal film formed on the substrate 11. In the first step, the metal film is formed, for example, by physical vapor deposition (PVD) such as coating, vacuum deposition and sputtering, a printing method with use of a metal paste, spraying or various plating methods. In the present embodiment, a copper foil is used as the metal film.

When a temporary fixing layer (not shown in drawing) is disposed between the substrate 11 and the bottom 19a of the through wiring, the temporary fixing layer comprises, for example, polyimide, polybenzoxazole, a resin containing a non-polar component such as silicon or fluorine, a resin containing a component that causes volume expansion or foaming by heating or ultraviolet (UV) irradiation, a resin containing a component that causes progress of a cross-linking reaction by heating or UV irradiation, or a resin that generates heat by irradiation of light. Examples of the method for forming the temporary fixing layer include spin coating, spray coating, and lamination. From the perspective of highly achieving both of handling properties and carrier release properties, it is preferable that the temporary fixing layer be easily peeled off by an external stimulus such as light and heat. From the perspective that the temporary fixing layer can be peeled off not to remain on the semiconductor wiring layer laminate 10 later produced, it is most preferable that the temporary fixing layer contain a resin that causes volume expansion by heat treatment.

When the temporary fixing layer is disposed between the substrate 11 and the bottom 19a of the through wiring, the bottom 19a of the through wiring may be formed from the copper foil as peelable copper foil. In that case, the substrate 11 corresponds to the support of the peelable copper foil, and the temporary fixing layer corresponds to the release layer of the peelable copper foil.

Subsequently, as shown in FIG. 3 (b), a third organic insulating layer 23 is formed on the substrate 11 to cover the bottom 19a of the through wiring as a second step. In the second step, the third organic insulating layer 23 can be formed, for example, by sticking a film of photosensitive insulating resin to the substrate 11. On an as needed basis, the film of photosensitive insulating resin is subjected to exposure, development, curing, and the like.

Subsequently, as shown in FIG. 3(c), a fourth organic insulating layer 24 is formed on the third organic insulating layer 23 as a third step, so that a first organic insulating layer 21 is formed. In the third step, in the same manner as in the second step, the fourth organic insulating layer can be formed by sticking a film comprising a photosensitive insulating resin to the third organic insulating layer 23. On an as needed basis, the film of photosensitive insulating resin is subjected to exposure, development, curing, and the like.

Subsequently, as shown in FIGS. 4 (a) and (b), a plurality of grooves 21a are formed in the first organic insulating layer 21 as a fourth step. In a fourth step, the grooves 21a are formed, for example, by laser abrasion, photolithography, or imprinting. From the perspectives of micronization and forming cost of the grooves 21a, it is preferable that photolithography be applied. For example, the photosensitive insulating resin used for forming the fourth organic insulating layer 24 is subjected to exposure and development, so that the grooves 21a can be formed.

As the method for exposing a photosensitive insulating resin by the above-mentioned photolithography, a known method such as projection exposure, contact exposure and direct drawing exposure may be used. Further, in order to develop a photosensitive insulating resin, an alkaline aqueous solution of sodium carbonate, tetramethylammonium hydroxide (TMAH) or the like may be used.

In the fourth step, the first organic insulating layer 21 may be further heat-cured after formation of the grooves 21a. In that case, the first organic insulating layer 21 is heat-cured, for example, under a preset heating temperature of 100 to 200° C. for a preset heating time of 30 minutes to 3 hours.

Subsequently, as shown in FIGS. 5 (a) and (b), a first barrier metal film 15 is formed on the first organic insulating layer 21 so as to cover the inner surface of the groove 21a as a fifth step. In the fifth step, the first barrier metal film 15 is formed, for example, by coating, PVD, printing with use of a metal paste, spraying or various plating methods. In a coating method, a complex of palladium or nickel is applied to the first organic insulating layer 21, and then heated to form a first barrier metal film 15. In the case of using a metal paste, a paste containing metal particles such as nickel and palladium applied to the first organic insulating layer 21 is sintered to form a first barrier metal film 15. In the present embodiment, a first barrier metal film 15 is formed by sputtering as one of PVD methods.

Subsequently, as shown in FIGS. 6 (a) and (b), a copper layer 13A for forming a copper wiring is formed on the first barrier metal film 15 such that the groove 21a is embedded as a sixth step. In the sixth step, the copper layer 13A is formed, for example, by a method with use of a metal paste, or plating by using the first barrier metal film 15 as seed layer. It is preferable that the thickness of the copper layer 13A be, for example, 0.5 times to 3 times the thickness of the first organic insulating layer 21. When the thickness of the copper layer 13A is 0.5 times or more, increase in the surface roughness of the copper wiring 13 to be formed in a post-process tends to be suppressed. Further, when the thickness of the copper layer 13A is 3 times or less, adhesion to the first organic insulating layer 21 tends to be excellent with the warpage of the copper layer 13A suppressed.

Subsequently, as shown in FIGS. 7 (a) and (b), the copper layer 13A is thinned such that the first organic insulating layer 21 is exposed as a seventh step. In the seventh step, a portion other than the groove 21a in the copper layer 13A and a portion not covering the groove 21a in the first barrier metal film 15 are mechanically or chemically removed. Thereby, the first organic insulating layer 21 is exposed and the copper layer 13A is thinned, so that the copper wiring 13 to be embedded in the groove 21a is formed. The thinning treatment may be a flattening treatment of the surfaces of the first organic insulating layer 21 and the copper wiring 13 combined together. In that case, the target portions of the copper layer 13A and the first barrier metal film 15 are removed by CMP or fly cutting, and the surface of the first organic insulating layer 21 is flattened by polishing or grinding.

In the case of using CMP in the seventh step, examples of the slurry for use include a slurry with a composition comprising alumina generally used for polishing resins, a slurry with a composition comprising hydrogen peroxide and silica used for polishing the first barrier metal film 15, and a slurry with a composition comprising hydrogen peroxide and ammonium persulfate used for polishing the copper layer 13A. From the perspectives of reducing costs and suppressing increase in the surface roughness, it is preferable that the slurry with a composition comprising alumina be used to grind the first organic insulating layer 21, the first barrier metal film 15 and the copper layer 13A. In the case of using CMP, the cost tends to be high. When the first organic insulating layer 21, the first barrier metal film 15 and the copper layer 13A (copper wiring 13) are flattened at the same time, dishing occurs in the copper wiring 13 due to the difference in the polishing rate, which tends to severely damage the flatness of the surfaces of the first organic insulating layer 21 and the copper wiring 13 combined together as a result. It is, therefore, more preferable that the first organic insulating layer 21, the first barrier metal film 15 and the copper layer 13A (copper wiring 13) be ground by fly cutting with use of a surface planer.

Subsequently, as shown in FIGS. 8 (a) and (b), a first inter-wiring layer insulating layer 17 is formed to cover the copper wiring 13 in the groove 21a as an eighth step. In the eighth step, the first inter-wiring layer insulating layer 17 is formed, for example, by spin coating, spray coating, bar coating, curtain coating, printing or lamination. From the perspective of easiness in handling, it is preferable that the first inter-wiring layer insulating layer 17 be formed from a resin composition in a film form. Further, from the perspectives of achieving a uniform thickness of the first inter-wiring layer insulating layer 17 and enlargement of the size, it is preferable that the first inter-wiring layer insulating layer 17 be formed by lamination. When the first inter-wiring layer insulating layer 17 is formed by lamination, a resin composition in a film form is stuck to the first organic insulating layer 21 in the same manner as in the second or the third step. In that case, from the perspective of reducing the residual stress, it is preferable that the temperature be set at 150° C. or less, and from the perspective of suppressing voids, it is preferable that the temperature be set at 60° C. or more.

In the eighth step, it is preferable that the first inter-wiring layer insulating layer 17 be formed not only on the copper wiring 13, but also on a portion in contact with a side of the groove 21a in the first barrier metal film 15. In that case, a portion of the copper wiring 13 (the sides and bottom of the copper wiring 13 opposed to the inner surface of the groove 21a) is covered with the first barrier metal film 15, and another portion of the copper wiring 13 (the top face of the copper wiring 13) is covered with a first inter-wiring layer insulating layer 17. The copper wiring 13 is covered with the first barrier metal film 15 and the first inter-wiring layer insulating layer 17 without a void.

Subsequently, as shown in FIGS. 9 (a) and (b), a second organic insulating layer 22 having a groove 22a is formed on the first inter-wiring layer insulating layer 17 as a ninth step. In the ninth step, first, a film of photosensitive insulating resin is stuck to the first inter-wiring layer insulating layer 17, in the same manner as in the third step. A plurality of grooves 22a are then formed in the stuck film of photosensitive insulating resin. In the ninth step, the groove 22a is formed by the same method as described in the fourth step for forming the groove 21a. In the ninth step, from the perspective of preventing diffusion of copper constituting the copper wiring 13, it is preferable that the second organic insulating layer 22 not be subjected to development.

Subsequently, as shown in FIGS. 10 (a) and (b), a second barrier metal film 16 and a copper layer 14A to be used for forming a copper wiring are sequentially formed on the second organic insulating layer as a tenth step. In the tenth step, first, the second barrier metal film 16 is formed on the second organic insulating layer 22 so as to cover the inner surface of the groove 22a by the same method as in the fifth step. The copper layer 14A is then formed on the second barrier metal film 16 so as to embed the groove 22a by the same method in the sixth step.

Subsequently, as shown in FIGS. 11 (a) and (b), the copper layer 14A is thinned to expose the second organic insulating layer 22 as an eleventh step. In the eleventh step, a portion of the copper layer 14A other than the groove 22a and a portion of the second barrier metal film 16 not covering the groove 22a are mechanically or chemically removed by the same method as in the seventh step. Thereby, the second organic insulating layer 22 is exposed and the copper layer 14A is thinned so as to form the copper wiring 14 embedded in the groove 22a.

Subsequently, as shown in FIGS. 12 (a) and (b), a second inter-wiring layer insulating layer 18 is formed to cover the copper wiring 14 in the groove 22a as a twelfth step. In the twelfth step, a second inter-wiring layer insulating layer 18 is formed on the second organic insulating layer 22 by the same method as in the eighth step. In the twelfth step, it is preferable that the second inter-wiring layer insulating layer 18 be formed not only on the copper wiring 14 but also on the portion in contact with the side of the groove 22a in the second barrier metal film 16. In that case, each of the sides and the bottom of the copper wiring 14 are covered with the second barrier metal film 16, and the top face of the copper wiring 14 is covered with the second inter-wiring layer insulating layer 18. The copper wiring 14 is covered with the second barrier metal film 16 and the second inter-wiring layer insulating layer 18 without a void.

Subsequently, as shown in FIG. 13 (a), a via 31 passing through the first organic insulating layer 21, the first inter-wiring layer insulating layer 17, the second organic insulating layer 22, and the second inter-wiring layer insulating layer 18 is formed as a thirteenth step. As the method for forming the via 31, for example, a laser is used. Examples of the laser include a carbon dioxide laser, a UV laser, a YAG laser and an excimer laser. It is preferable that the inner part of the via 31 be cleaned by a known method such as desmear treatment after formation of the via 31.

Subsequently, as shown in FIG. 13 (b), the via 31 is filled with a metal material to form an in-via conductive portion 19b, so that a through wiring 19 having a bottom 19a and the in-via conductive portion 19b is formed as a fourteenth step. In the fourteenth step, the in-via conductive portion 19b is formed, for example, by PVD or various plating methods. Examples of the metal material include copper, nickel and tin. Through the steps described above, the wiring layer laminate 10 shown in FIG. 2 is formed. When a temporary fixing layer is disposed, the wiring layer laminate 10 may be peeled off from the substrate 11.

In the wiring layer laminate 10 formed by the production method described above, the inter-wiring layer insulating layer has a moisture absorptivity of 1% by mass or less after left standing in an environment at 130° C. and a relative humidity of 85% for 2 hours, so that the amount of moisture contained in the inter-wiring layer insulating layer is extremely small. The diffusion of copper into the inter-wiring layer insulating layer caused by the reaction between water and copper in the inter-wiring layer insulating layer can be, therefore, well suppressed. As a result, the insulation properties of the inter-wiring layer insulating layer can be well maintained to prevent short-circuiting between the copper wirings, so that the insulation reliability of the wiring layer laminate 10 can be well improved.

A plurality of semiconductor chips are mounted on the wiring layer laminate 10 in the present embodiment, so that a semiconductor device with the semiconductor chips integrated with a good yield can be provided.

The present disclosure is not limited to the embodiment described above, and appropriate modifications may be performed within a scope of the gist. For example, between the first organic insulating layer 21 and the substrate 1, a photosensitive insulating resin-containing resin layer, an inter-wiring layer insulating layer, a build-up material, or the like may be formed.

On the first inter-wiring layer insulating layer 17, instead of the second organic insulting layer 22, the copper wiring 14, and the like, a resin layer such as a photosensitive insulating resin-containing resin layer, an inter-wiring layer insulating layer, a build-up material and an underfill may be formed, or a copper wiring, a bump or the like may be formed. Further, a via in which a metal material for connecting the copper wirings 13 and 14 is embedded may be disposed in the first inter-wiring layer insulating layer 17.

On the second inter-wiring layer insulating layer 18, a resin layer such as a photosensitive insulating resin-containing resin layer, an inter-wiring layer insulating layer, a build-up material, and an underfill may be formed, or a copper wiring, a bump or the like may be formed. Further, in the second inter-wiring layer insulating layer 18, a via in which a metal material for connecting the copper wiring 14 to semiconductor chips and the like is embedded may be provided.

EXAMPLES

The present invention is described in more detail with reference to the following Examples, though the present invention is not limited to these Examples.

Example 1

A sample for measurement and evaluation shown in FIGS. 14 (a) and (b) was prepared in the following manner. First, a photosensitive insulating resin film 52 having a thickness of 3 μm was stuck to a silicon wafer 51 having a thickness of 150 mm. The photosensitive insulating resin film 52 was formed in the following manner. First, a cresol novolac resin (manufactured by Asahi Yukizai Corporation, trade name: TR-4020G, 100 parts by mass), 1,3,4,6-tetrakis (methoxymethyl)glycoluril (30 parts by mass), trimethylolpropane triglycidyl ether (40 parts by mass), triarylsulfonium salt (manufactured by San-Apro Ltd., trade name: CPI-310B, 8 parts by mass) and methyl ethyl ketone (100 parts by mass) were compounded to obtain a photosensitive insulating resin. Subsequently, the obtained photosensitive insulating resin was applied to a polyethylene terephthalate film (manufactured by DuPont Teijin Films, trade name: A-53) and dried in an oven at 90° C. for 10 minutes to make a photosensitive insulating resin film 52 having a thickness of 3 μm.

Subsequently, the photosensitive insulating resin film 52 stuck to the silicon wafer 51 was subjected to exposure, heating, development, and heat curing treatment in sequence. Subsequently, a photosensitive insulating film 53 having a thickness of 3 μm formed in the same manner as the film 52 was stuck to the photosensitive insulating resin film 52. Subsequently, the stuck photosensitive insulating resin film 53 was subjected to exposure through a photomask and then subjected to heating, development and heat curing treatment in sequence. Thereby, patterning of the photosensitive insulating resin film 53 was performed, so that first grooves 53a and second grooves 53b in a comb teeth shape engaging with each other, a first connection part 53c for connecting the first grooves 53a to each other, and a second connection part 53d for connecting the second grooves 53b to each other were formed. The width of the first grooves 53a and the width of the second grooves 53b each were set at 5 μm. These widths correspond to the line width L of the wiring described below. The distance between the first groove 53a and the second groove 53b adjacent to each other (space width S) was set at 5 μm, and each of the groove lengths was set at 1 mm.

Subsequently, a titanium-containing barrier metal film 54 having a thickness of 0.05 μm was formed on the photosensitive insulating resin film 53 by sputtering. Subsequently, a copper layer was formed to embed the first grooves 53a, second grooves 53b, the first connection part 53c and the second connection part 53d by electroplating using the barrier metal film 54 as a seed layer. Subsequently, a part of the copper layer and a part of the barrier metal film 54 not covering inner surfaces of the first grooves 53a, the second grooves 53b, the first connection part 53c and the second connection part 53d were ground by fly cutting with use of a surface planer. Thereby, a first wiring 55a embedded in the first grooves 53a, a second wiring 55b embedded in the second grooves 53b, a first connection wiring 55c embedded in the first connection part 53c, and a second connection wiring 55d embedded in the second connection part 53d were formed. As the surface planer, an automatic surface planer (manufactured by DISCO Inc., trade name "DAS8930") was used. In grinding by fly cutting, the feed rate was set at 1 mm/s, and the spindle rotation speed was set at 2000 min$^{-1}$.

Subsequently, a curable film having a thickness of 10 μm was stuck to expose at least a part of the first connection wiring 55c and a part of the second connection wiring 55d, and then heat-cured to form an inter-wiring layer insulating layer 57. The curable film was stuck to embed at least the first wiring 55a and the second wiring 55b. As the curable film, a material A described below was used.

<Material A>

First, in order to synthesize a thermoplastic resin having a siloxane chain, 25 g of "BMI-3000" (manufactured by Designer Molecules Inc., trade name) and 25 g of 2,2-bis (4-(4-maleimide phenoxy)phenyl)propane (manufactured by Daiwa Kasei Industry Co., Ltd., trade name: BMI-4000) and 150 g of toluene were placed in a flask, and the mixture was stirred for 20 minutes. Subsequently, 16.4 g of silicone diamine (manufactured by Shin-Etsu Chemical Co., Ltd., trade name: KF-8010) was placed in the flask, so as to be heated to 130° C. in an oil bath. The mixture was reacted with stirring for 3 hours from the initiation of reflux, and cooled to room temperature by air cooling, so that a thermoplastic resin having a silicone chain in a solid form. Subsequently, a thermosetting elastomer (manufactured by Asahi Kasei Corporation, trade name: TUFTEC M1911) dissolved in toluene with a solid content of 50 g, the thermoplastic resin having a silicone chain with a solid content of 50 g, and 2 g of a curing agent (NOF Corporation, trade name: PERHEXINE 25B) were compounded. Through stirring for 30 minutes, the compounded product was uniformly dispersed, so that a varnish of the resin composition to form an inter-wiring layer insulating layer with a controlled non-volatile content of 20% was formed. The varnish of the resin composition obtained was applied to a PET film with release treatment (thickness: 38 μm, trade name: NR-1) with a table-top coater. The thickness of the coating film was controlled to 10 μm after drying with an applicator. Subsequently, the coating film of the resin composition was dried by heating at 130° C. for 10 minutes, so that a curable film (material A) was formed on the PET film. The PET film was then removed, and the curable film (material A) was used to form the inter-wiring layer insulating layer 57. The inter-wiring layer insulating layer 57 in Example 1 (cured product of material A) had a moisture absorptivity of 1.0% by mass or less, a chloride ion content of 3 ppm or less, an elongation at fracture of 150%, and a storage modulus at 40° C. of 60 MPa.

Subsequently, with reference to FIG. 14 again, a photosensitive resin film 58 having a thickness of 3 μm, formed in the same manner as the photosensitive insulating resin film 52, was stuck to the inter-wiring layer insulating layer film 57. The photosensitive insulating resin film was then subjected to exposure, development and heat curing treatment. Thereby, a sample 50 for measurement and evaluation shown in FIGS. 14 (a) and (b) was formed. In the sample 50 for measurement and evaluation, the first wirings 55a are connected to each other with the first connection wiring 55c, and covered with the barrier metal film 54 and the inter-wiring layer insulating layer 57. Further, the second wirings 55b are connected to each other with a second connection wiring 55d, and covered with the barrier metal film 54 and the inter-wiring layer insulating layer 57.

To confirm the insulation reliability of the sample for measurement and evaluation 50 described above, a Highly Accelerated Stress Test (HAST) was performed. In the test, a voltage of 3.3 V was applied to the first connection wiring 55c and the second connection wiring 55d under conditions of a humidity of 85% at 130° C., which were left standing for predetermined hours. Accordingly, the changes in insulation properties of the first wiring 55a and the second wiring 55b with time were measured. In the test, in the case of a resistance value between the first wiring 55a and second wiring 55b of 1×10⁶Ω or more at an elapsed period of 200 hours from the start of the test, the sample was evaluated as rank A, while in the case of less than 1×10⁶Ω before an elapsed time of 200 hours from the start of the test, the sample was evaluated as rank B. The results of the highly accelerated stress test in Example 1 are shown in the following Table 1.

Example 2

A sample for measurement and evaluation 50 was formed in the same manner as in Example 1, except that the line width L and the space width S were set at 3 μm, and the sample was subjected to the highly accelerated stress test described above. The results of the highly accelerated stress test in Example 2 are shown in the following Table 1.

Example 3

A sample for measurement and evaluation 50 was formed in the same manner as in Example 1, except that the line width L and the space width S were set at 2 μm, and the sample was subjected to the highly accelerated stress test described above. The results of the highly accelerated stress test in Example 3 are shown in the following Table 1.

Example 4

A sample for measurement and evaluation 50 was formed in the same manner as in Example 2, except that the curable film for forming the inter-wiring layer insulating layer 57 was prepared by using the following material B. The sample for measurement and evaluation 50 was subjected to the highly accelerated stress test described above. The results of the highly accelerated stress test in Example 4 are shown in the following Table 1.

<Material B>

First, in order to synthesize a thermoplastic resin having a siloxane chain, into a 500-ml flask equipped with a stirrer, a thermometer and a nitrogen purging device (nitrogen inflow tube), 8.17 g of 1,4-butanediol bis(3-aminopropyl)ether as diamine (manufactured by Tokyo Chemical industry Co., Ltd., trade name: B-12), 21.65 g of polyoxypropylene diamine (manufactured by BASF Japan Ltd., trade name: D-400), 8.6 g of silicone diamine (manufactured by Shin-Etsu Chemical Co., Ltd., trade name: KF-8010), and 250 g of NMP (N-methyl-2-pyrrolidone) as a solvent were added, and stirred to dissolve the diamine in a solvent. Subsequently, a reflux condenser equipped with a water receiver was mounted on the flask, and the content was heated to 180° C. while purging with nitrogen gas, and held at 180° C. for 5 hours, so that a reaction proceeded while removing water. The solution thus obtained was cooled to room temperature.

Subsequently, a polybutadiene resin dissolved in NMP (manufactured by Cray Valley, trade name: Ricon 130MA8) with a solid content of 50 g, the thermoplastic resin having a siloxane chain with a solid content of 50 g, 2 g of a curing agent (manufactured by NOF Corporation, trade name: PERHEXINE 25B), and 1 g of G8009L (trade name, manufactured by DKS Co. Ltd.) were compounded. Through stirring for 30 minutes, the compounded product was uniformly dispersed, so that a varnish of the resin composition to form an inter-wiring layer insulating layer was formed. The varnish of the resin composition obtained was applied to a PET film with release treatment (thickness: 38 μm, trade name: NR-1) with a table-top coater. The thickness of the coating film of the resin composition was controlled to 10 μm after drying with an applicator. Subsequently, the coating film of the resin composition was dried by heating at 120° C. for 20 minutes, so that a curable film (material B) was formed on the PET film. The PET film was then removed, and the curable film (material B) was used to form the inter-wiring layer insulating layer 57. The inter-wiring layer insulating layer 57 in Example 4 (cured product of material B) had a moisture absorptivity of 1.0% by mass or less, a chloride ion content of 3 ppm or less, an elongation at fracture of 70%, and a storage modulus at 40° C. of 180 MPa.

Example 5

A sample for measurement and evaluation 50 was formed in the same manner as in Example 4, except that the line width L and the space width S were set at 2 μm, and the sample was subjected to the highly accelerated stress test described above. The results of the highly accelerated stress test in Example 5 are shown in the following Table 1.

Example 6

A sample for measurement and evaluation 50 was formed in the same manner as in Example 2, except that the curable film for forming the inter-wiring layer insulating layer 57 was prepared by using the following material C. The sample for measurement and evaluation 50 was subjected to the highly accelerated stress test described above. The results of the highly accelerated stress test in Example 6 are shown in the following Table 1.

<Material C>

First, in order to synthesize a thermoplastic resin, into a flask equipped with a stirrer, a thermometer and a nitrogen purging device (nitrogen inflow tube), 10.3 g of 2,2-bis(4-(4-aminophenoxy)phenyl)propane, 4.1 g of 1,4-butanediol bis(3-aminopropyl)ether (manufactured by Tokyo Chemical industry Co., Ltd., trade name: B-12), and 101 g of NMP were added. Subsequently, 20.5 g of 1,2-(ethylene)bis(trimellitate anhydride) was added into the flask, and stirred at room temperature for 1 hour. Subsequently, a reflux condenser equipped with a water receiver was mounted on the flask, and the content was heated to 180° C. while purging with nitrogen gas, and held at 180° C. for 5 hours, so that a reaction proceeded while removing water. The solution thus obtained was cooled to room temperature. Subsequently, a polybutadiene resin dissolved in NMP (manufactured by CRAY VALLEY, trade name: Ricon 130MA8) with a solid content of 50 g, the thermoplastic resin with a solid content of 50 g, 2 g of a curing agent (manufactured by NOF Corporation, trade name: PERHEXINE 25B), an epoxy resin (manufactured by Nippon Kayaku Co., Ltd., trade name: NC3000H) with a solid content of 10 g, 1 g of G8009L (trade name, manufactured by DKS Co. Ltd.), and a silica slurry (manufactured by Admatechs Company Limited, trade name: SC2050-KNK) with a solid content of 70 g were compounded. Through stirring for 30 minutes, the compounded product was uniformly dispersed, so that a varnish of the resin composition to form an inter-wiring layer insulating layer was formed. The varnish of the resin composition obtained was applied to a PET film with release treatment (thickness: 38 μm, trade name: NR-1) with a table-top coater. The thickness of the coating film of the resin composition was controlled to 10 μm after drying with an applicator. Subsequently, the coating film of the resin composition was dried by heating at 120° C. for 20 minutes, so that a curable film (material C) was formed on the PET film. The PET film was then removed, and the curable film (material C) was used to form the inter-wiring layer insulating layer 57. The inter-wiring layer insulating layer 57 in Example 6 (cured product of material C) had a moisture absorptivity of 1.0% by mass or less, a chloride ion content of 5 ppm or less, an elongation at fracture of 3%, and a storage modulus at 40° C. of 11 GPa.

Comparative Example 1

A sample for measurement and evaluation 50 was formed in the same manner as in Example 1, except that the inter-wiring layer insulating layer 57 was formed from the following material D. The stuck material D, however, was subjected to an exposure of 500 mJ/cm$^2$ with a high-precision parallel exposure machine (manufactured by ORC Manufacturing Co., LTD., trade name: EXM-1172-B-∞) and then subjected to heat curing treatment. The sample for measurement and evaluation 50 was subjected to the highly accelerated stress test described above. The results of the highly accelerated stress test in Comparative Example 1 are shown in the following Table 1.
<Material D>
The material D is a film having a thickness of 10 μm, formed from the same photosensitive insulating resin as the photosensitive insulating resin film 52 and the like. The cured product of material D had a moisture absorptivity of 2.0% by mass and a chloride ion content of 8.6 ppm.

Comparative Example 2

A sample for measurement and evaluation 50 was formed in the same manner as in Comparative Example 1, except that the line width L and the space width S were set at 2 μm, and the sample was subjected to the highly accelerated stress test described above. The results of the highly accelerated stress test in Comparative Example 2 are shown in the following Table 1.

Comparative Example 3

A sample for measurement and evaluation 50 was formed in the same manner as in Comparative Example 1, except that the inter-wiring layer insulating layer 57 was formed from the following material E, and the line width L and the space width S were set at 3 μm. The sample for measurement and evaluation 50 was subjected to the highly accelerated stress test described above. The results of the highly accelerated stress test in Comparative Example 3 are shown in the following Table 1.
<Material E>
As the material E, FZ-2700GA (manufactured by Hitachi Chemical Co., Ltd., trade name) was used. The cured product of material E had a moisture absorptivity of 1.3% by mass and a chloride ion content of 6.3 ppm.

Comparative Example 4

A sample for measurement and evaluation 50 was formed in the same manner as in Comparative Example 1, except that the curable resin film to form the inter-wiring layer insulating layer 57 was formed from the following material F and the line width L and the space width S were set at 3 μm. The sample for measurement and evaluation 50 was subjected to the highly accelerated stress test described above. The results of the highly accelerated stress test in Comparative Example 4 are shown in the following Table 1.
<Material F>
First, in order to synthesize a thermoplastic resin, into a flask equipped with a stirrer, a thermometer and a nitrogen purging device, 2.16 g of 5,5'-methylene-bis(anthranilic acid), 15.13 g of aliphatic ether diamine (manufactured by BASF Japan Ltd., trade name: D-400), 1.63 g of 1,1,3,3-tetramethyl-1,3-bis(4-aminophenyl)disiloxane (manufactured by Shin-Etsu Chemical Co., Ltd., trade name: LP-7100), and 115 g of NMP were compounded. Subsequently, 16.51 g of oxydiphthalic acid anhydride (ODPA) was added into the flask, and the mixture was stirred at room temperature for 1 hour. Subsequently, while nitrogen gas is blown into the flask, the temperature was raised to 180° C., and held at 180° C. for 5 hours, so that a reaction proceeded while removing water. The solution thus obtained was cooled to room temperature. An epoxy resin (manufactured by Nippon Kayaku Co., Ltd., trade name: NC3000H) with a solid content of 30 g dissolved in NMP, the thermoplastic resin with a solid content of 50 g, and 1 g of 2P4MHZ as curing agent (manufactured by Shikoku Chemicals Corporation, trade name) were compounded. Through stirring for 30 minutes, the compounded product was uniformly dispersed, so that a varnish of the resin composition was formed. The varnish of the resin composition obtained was applied to a PET film with release treatment (thickness: 38 μm, trade name: NR-1) with a table-top coater. The coating film of the resin composition was controlled to 10 μm after drying with an applicator. Subsequently, the coating film of the resin composition was dried by heating at 120° C. for 20 minutes, so that a curable film (material F) was formed on the PET film. The PET film was then removed, and the curable film (material F) was used to form the inter-wiring layer insulating layer. The inter-wiring layer insulating layer in Comparative Example 4 (cured product of material F) had a moisture absorptivity of 1.2% by mass, a chloride ion content of 5 ppm or less.

TABLE 1

| | Line width L (μm) | Space width S (μm) | Inter-wiring layer insulating layer 57 | | Highly accelerated stress test |
|---|---|---|---|---|---|
| Example 1 | 5 | 5 | Y | Material A | A |
| Example 2 | 3 | 3 | Y | Material A | A |
| Example 3 | 2 | 2 | Y | Material A | A |
| Example 4 | 3 | 3 | Y | Material B | A |
| Example 5 | 2 | 2 | Y | Material B | A |
| Example 6 | 3 | 3 | Y | Material C | A |
| Comparative Example 1 | 5 | 5 | N | Material D | B |
| Comparative Example 2 | 2 | 2 | N | Material D | B |
| Comparative Example 3 | 3 | 3 | N | Material E | B |
| Comparative Example 4 | 3 | 3 | N | Material F | B |

In the Table 1, inter-wiring layer insulating layers 57 having a moisture absorptivity of 1.0% by mass or less are denoted as "Y", and inter-wiring layer insulating layers 57 having a moisture absorptivity of more than 1.0% by mass are denoted as "N". As shown in Table 1, all of the results of the highly accelerated life test in Examples 1 to 6 were evaluated as rank A, while all of the results of the highly accelerated life test in Comparative Examples 1 to 4 were evaluated as rank B. From the results, it was found that the presence or absence of the inter-wiring layer insulating layer 57 having a moisture absorptivity of 1.0% by mass or less makes a large difference in the insulation reliability of the sample for measurement and evaluation 50.

Figure 15:
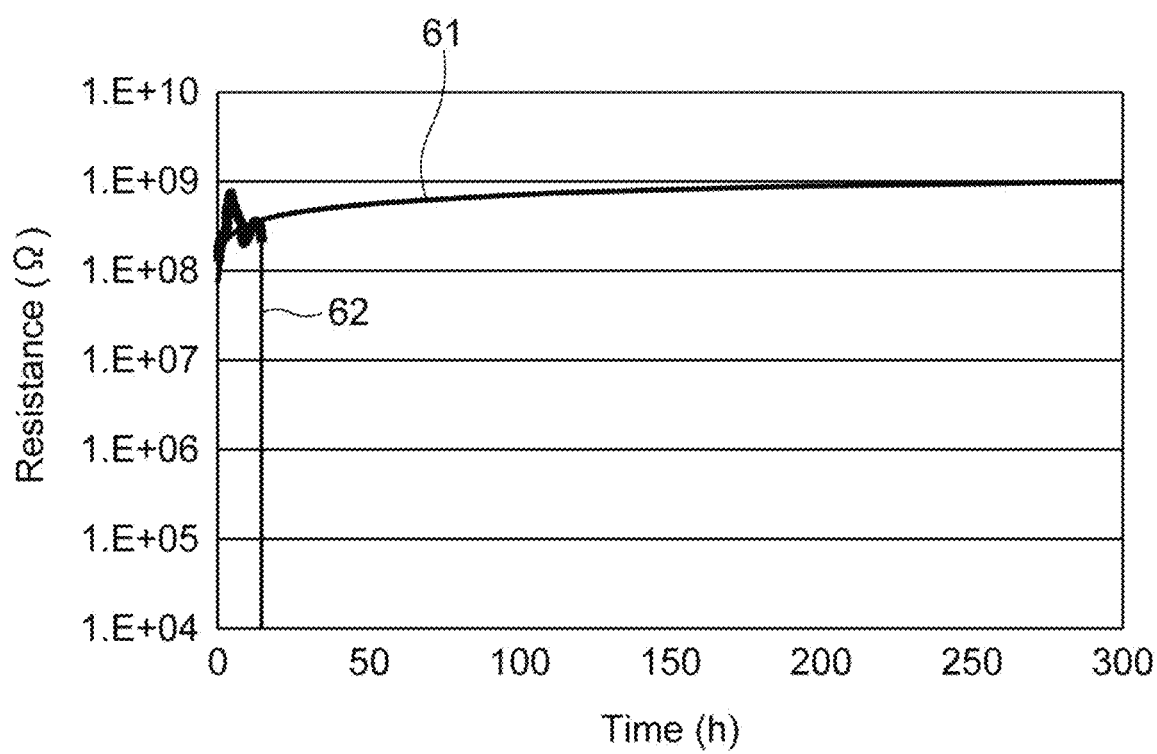
FIG. 15 is a graph showing the results on a highly accelerated life test in Example 3 and Comparative Example 2.

FIG. 15 is a graph showing results of the highly accelerated life test in Example 3 and Comparative Example 2. In FIG. 13, the abscissa shows time, and the ordinate shows the resistance value between the first wiring 55a and the second wiring 55b. In FIG. 15, data 61 are test results in Example 3, and data 62 are the test results in Comparative Example 2.

As shown in FIG. 15, in Example 3, the indicated resistance value between the first wiring 55a and the second wiring 55b at an elapsed period of 300 hours from the start of the test was $1\times10^7 \Omega$ or more. In contrast, in Comparative Example 2, the resistance value drastically decreased to less than $1\times10^7 \Omega$ at a period of about 20 hours from the start of the test.

FIG. 16 (a) is an observation view of the sample for measurement and evaluation 50 after the highly accelerated stress test in Example 3; and FIG. 16 (b) is an observation view of the sample for measurement and evaluation 50 after the highly accelerated stress test in Comparative Example 2. As shown in FIG. 16 (b), it was confirmed that in Comparative Example 2, at least the first wiring 55a and the second wiring 55b were corroded by any cause. In contrast, as shown in FIG. 16 (b), no distinct corrosion was identified in the wiring and the like in Example 3.

Examples 7 to 13

The following components each were stirred at 25° C. for 30 minutes or more so as to obtain a composition shown in Table 1, and then filtered with a #200 nylon mesh (opening: 75 μm) so as to obtain a resin composition (varnish).

Component (A-1): maleimide compounds represented by the following formula (a mixture with n=1 to 10, weight average molecular weight: about 15000 to 20000):

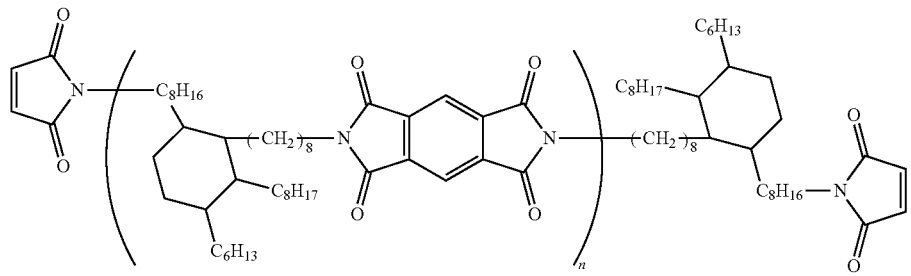

Component (A-2): a mixture of maleimide compounds represented by the following formulas:

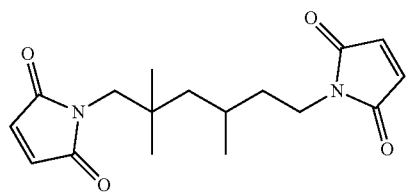

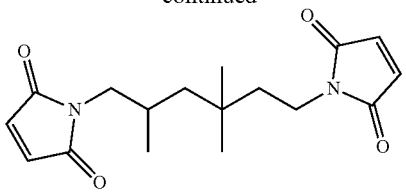

Component (B): a compound having a (meth)acryloyl group (manufactured by Shin-Nakamura Chemical Co., Ltd., trade name: A-DCP) Component (C): a radical photopolymerization initiator (manufactured by BASF Corporation, trade name: Irgacure 907)

Component (D-1): a silane coupling agent having an epoxy group (manufactured by Shin-Etsu Chemical Co. Ltd., trade name: X-12-984S)

Component (D-2): a silane coupling agent having an epoxy group (manufactured by Shin-Etsu Chemical Co. Ltd., trade name: KBM-403)

The resin composition (varnish) in each of Examples was evaluated as follows. The results are shown in Table 2.

<Evaluation on Dielectric Properties (Dielectric Constant: Dk, and Dielectric Loss Tangent: Df)>

For evaluation on dielectric characteristics, the varnish was applied to a copper foil with a table top coater so as to have a thickness of 50 μm after drying, and dried to obtain a resin film (semi-cured). Subsequently, the obtained resin film (semi-cured) was irradiated with UV at 2000 mJ/cm2 On the resin film thus prepared, resin films were formed and laminated in the same manner, so that the thickness of the resin film was controlled to 300 μm. Further, the copper foil as a support was removed through physical peeling or etching to obtain a resin film for evaluation.

The resin film was cut into a sample piece having a length of 60 mm, a width of 2 mm, and a thickness of 0.3 mm, of which the dielectric properties were measured by a cavity resonator perturbation method. As the measuring instrument, a vector type network analyzer E8364B manufactured by Agilent Technologies was used; as the cavity resonator, CP531 (10-GHz band resonator) manufactured by Kanto Electronic Application and Development Inc. was used; and as the measurement program, CPMA-V2 was used, respectively. The specified conditions include a frequency of 10 GHz and a measurement temperature of 25° C.

<Measurement of Moisture Absorptivity>

The varnish was applied to a wafer (6-inch diameter, thickness: 400 μm) with a spin coater, and dried at 90° C. for 5 minutes to form a resin layer. After curing through exposure at 2000 mJ/cm², a sample was prepared by heating at 180° C. for 1 hour. The sample was left to stand in a constant temperature and humidity chamber at 130° C. and a relative humidity of 85% (manufactured by ESPEC Corp., trade name: EHS-221MD) for 200 hours. The sample was taken out after the internal temperature of the constant temperature and humidity chamber was lowered to 50° C., and a part of the resin was scraped off from the silicon wafer. A part of the scraped resin was measured with a differential thermogravimetric simultaneous analysis apparatus (trade name "TG/DTA6300", manufactured by Hitachi High-Technologies Corporation), under conditions of a temperature rising rate of 10° C./min, a nitrogen flow of 400 mL/min, and a temperature range of 25° C. to 150° C. The mass reduction ratio at 150° C. was calculated as moisture absorptivity.

<Measurement of Elongation Percentage>

A resin film prepared by the same method described above was cut into a sample with a length of 30 mm and a width of 5 mm, of which the elongation at fracture was measured with a small table-top testing machine (trade name: EZ-S, manufactured by Shimadzu Corporation) at a feed rate of 5 mm/min.

<Evaluation on Formability of Fine Wiring>

On a silicon wafer (6-inch diameter, thickness: 400 μm) the varnish was applied by spin coating, and dried by heating at 90° C. for 5 minutes to form a resin film on the silicon wafer. At that time, the thickness of the resin after drying was controlled to 5 μm through adjustment of the spin coating conditions. Subsequently, a negative pattern mask having Line/Space (L/S (μm/μm)) ratios of 200/200, 100/100, 80/80, 60/60, 50/50, 40/40, 30/30, 20/20, 10/10, 7/7, 5/5, 4/4, and 3/3, and via diameters of 50, 40, 30, 20, 10, 7, 5, 4, and 3 μm, was placed and an exposure at 1000 mJ/cm$^2$ was performed with a high-precision parallel exposure machine (manufactured by ORC Manufacturing Co., LTD., trade name: EXM-1172-B-∞). Further, additional heating was performed under conditions at 100° C. for 1 minute to obtain a sample. The sample thus obtained was immersed in cyclopentanone at normal temperature for 60 seconds while oscillating, and subsequently, rinsed with cyclopentanone and then immersed in isopropyl alcohol at normal temperature for 5 seconds. The isopropyl alcohol was then evaporated by blowing pressurized air or the like.

For evaluation of the fine wiring formability, the presence or absence of peeling of the resin film from the wafer, cracking in the resin film, and the roughness of pattern edges, and presence or absence of residues at the pattern bottom after development of the resin was identified with a metallurgical microscope. The minimum L/S and via diameter at which none of these defects was identified are shown in Table 2.

<Resistance to b-HAST>

A pattern was formed in the same manner as in the highly accelerated stress test. Subsequently, plating up was performed by electroless-electrolytic copper plating or the like and the surface was flattened by CMP. The mask size was adjusted to have an L/S (μm/μm) of 3/3 and 5/5.

Subsequently, on the resulting wiring, vanish was laminated by spin coating and dried at 90° C. for 5 minutes. When spin coating was performed, a polyimide tape was stuck to the portions 55c and 55d of the wiring so as to prevent the resin from being coated, and the polyimide tape was peeled off after UV curing. The film thickness of the resin film was controlled to 5 μm through adjustment of the spin coating conditions. After irradiated with UV at 1000 mJ/cm$^2$, the resin film was heated at 180° C. for 1 hour to be cured. A resin layer prepared by exactly the same method except for pattern formation was present between the wafer (6-inch diameter, thickness: 400 μm) as base material and the wiring layer.

Under conditions of a humidity of 85% at 130° C., a voltage of 3.3 V was applied to the wirings thus obtained: the first connection wiring 55c and the second connection wiring 55d, which were then left standing for a predetermined time. Accordingly, changes in the insulation properties of the first wiring 55a and the second wiring 55b with time were measured. In this test, samples with a resistance value between the first wiring 55a and the second wiring 55b of 1×10$^6$Ω or more for 300 hours or more were evaluated as rank "A" (having resistance to b-HAST), and other samples not satisfying the above were evaluated as rank "B" (not having resistance to b-HAST).

TABLE 2

|  |  | Example | | | | | | |
|---|---|---|---|---|---|---|---|---|
|  |  | 7 | 8 | 9 | 10 | 11 | 12 | 13 |
| Composition (parts by mass) | (A-1) | 100 | 100 | 90 | 80 | — | — | — |
|  | (A-2) | — | — | — | — | 100 | 90 | 80 |
|  | (B) | — | — | 10 | 20 | — | 10 | 20 |
|  | (C) | 5 | 5 | 5 | 5 | 5 | 5 | 5 |
|  | (D-1) | 0.3 | — | 0.3 | 0.3 | 0.3 | 0.3 | 0.3 |
|  | (D-2) | — | 0.3 | — | — | — | — | — |
| Dielectric properties | Dk | 2.2 | 2.2 | 2.3 | 2.4 | 2.3 | 2.3 | 2.4 |
|  | Df | 0.0020 | 0.0020 | 0.0030 | 0.0040 | 0.0025 | 0.0035 | 0.0045 |
| Moisture absorptivity | % by weight | 0.3 | 0.3 | 0.4 | 0.5 | 0.3 | 0.4 | 0.5 |
| Elongation percentage | % | 60 | 60 | 55 | 50 | 45 | 40 | 35 |
| Fine wiring formability | L/S (μm) | 5/5 | 5/5 | 5/5 | 5/5 | 5/5 | 5/5 | 5/5 |
|  | Via (μm) | 5 | 5 | 5 | 5 | 5 | 5 | 5 |
| Resistance to b-HAST | 3/3 | A | A | A | A | A | A | A |
|  | 5/5 | A | A | A | A | A | A | A |

REFERENCE SIGNS LIST

1: substrate, 2a to 2d: semiconductor chip, 3a and 3b: underfill, 4: insulating material, 10: wiring layer laminate for semiconductor, 11: substrate, 13: copper wiring, 13a: copper layer, 14: copper wiring, 14a: copper layer, 15 and 16: barrier metal film, 17 and 18: inter-wiring layer insulating layer, 21: organic insulating layer, 21a: groove, 22: organic insulating layer, 22a: groove, 100: semiconductor package, 1: line width, s: space width.

The invention claimed is:

1. A wiring layer laminate for a semiconductor, comprising:
a plurality of wiring layers comprising
an organic insulating layer,
a copper wiring disposed in the organic insulating layer, and
a barrier metal film separating the copper wiring and the organic insulating layer; and
an inter-wiring layer insulating layer disposed between the plurality of wiring layers;
wherein a portion of a surface of the copper wiring is exposed to a principal surface side of one or both of the wiring layer,
the exposed surface of the copper wiring is in contact with the inter-wiring layer insulating layer, and
the inter-wiring layer insulating layer is a layer having a moisture absorptivity of 1% by mass or less after placed in an environment at 130° C. and a relative humidity of 85% for 200 hours.

2. The wiring layer laminate for a semiconductor according to claim 1, wherein the inter-wiring layer insulating layer is a cured product of a resin composition comprising:
a curable resin; and
a curing agent.

3. The wiring layer laminate for a semiconductor according to claim 2, wherein the curable resin has at least two maleimide groups and a divalent hydrocarbon group.

4. The wiring layer laminate for a semiconductor according to claim 3, wherein the hydrocarbon group comprises a chain alkylene group having a main chain with 4 or more carbon atoms.

5. The wiring layer laminate for a semiconductor according to claim 3, wherein the hydrocarbon group has 8 or more carbon atoms.

6. The wiring layer laminate for a semiconductor according to claim 3, the hydrocarbon group is a group represented by the following formula (II):

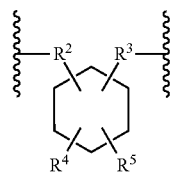

(II)

wherein $R^2$ and $R^3$ each independently represent an alkylene group, and $R^4$ and $R^5$ each independently represent an alkyl group.

7. The wiring layer laminate for a semiconductor according to claim 3, the curing agent comprises a radical photopolymerization initiator.

8. The wiring layer laminate for a semiconductor according to claim 3, wherein the resin composition further comprises a compound having a (meth)acryloyl group.

9. The wiring layer laminate for a semiconductor according to claim 3, wherein the resin composition further comprises a coupling agent.

10. The wiring layer laminate for a semiconductor according to claim 2, the curable resin has a divalent organic group having at least 2 imide bonds.

11. The wiring layer laminate for a semiconductor according to claim 10, the divalent organic group is a group represented by the following formula (I):

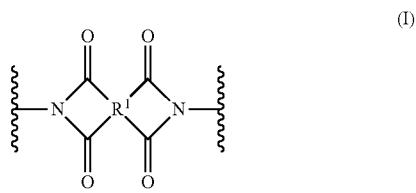

(I)

wherein $R^1$ represents a tetravalent organic group.

12. The wiring layer laminate for a semiconductor according to claim 2, wherein the resin composition further comprises a thermoplastic resin.

13. The wiring layer laminate for a semiconductor according to claim 1, wherein the organic insulating layer is a layer formed from photosensitive insulating resin.

14. The wiring layer laminate for a semiconductor according to claim 1, wherein a dielectric constant of the inter-wiring layer insulating layer upon application of 10 GHz is 3.0 or less.

15. The wiring layer laminate for a semiconductor according to claim 1, wherein a dielectric loss tangent of the inter-wiring layer insulating layer upon application of 10 GHz is 0.005 or less.

16. The wiring layer laminate for a semiconductor according to claim 1, wherein a 5% weight loss temperature of the inter-wiring layer insulating layer is 300° C. or more.

17. A semiconductor device comprising:
the wiring laminate for a semiconductor according to claim 1; and
a semiconductor element electrically connected to the copper wiring.

* * * * *